United States Patent
Mahajan

(10) Patent No.: US 12,068,401 B2
(45) Date of Patent: Aug. 20, 2024

(54) HIGH HOLDING VOLTAGE BIPOLAR JUNCTION DEVICE

(71) Applicant: GlobalFoundries U.S. Inc., Malta, NY (US)

(72) Inventor: Prantik Mahajan, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/713,277

(22) Filed: Apr. 5, 2022

(65) Prior Publication Data

US 2023/0317835 A1    Oct. 5, 2023

(51) Int. Cl.
  *H01L 29/735*    (2006.01)
  *H01L 27/02*    (2006.01)
  (Continued)

(52) U.S. Cl.
  CPC ........ *H01L 29/735* (2013.01); *H01L 27/0248* (2013.01); *H01L 29/0649* (2013.01);
  (Continued)

(58) Field of Classification Search
  CPC ............... H01L 29/0649; H01L 29/735; H01L 29/0808; H01L 29/0821; H01L 29/1008; H01L 27/0248; H01L 27/0262; H01L 27/0259; H01L 27/0296; H01L 27/1203; H01L 29/0692; H01L 29/0804; H01L 29/0817; H01L 29/1004; H01L 29/167;
  (Continued)

(56) References Cited

U.S. PATENT DOCUMENTS

| 8,129,818 B2 * | 3/2012 | Tooi ............... H01L 29/1095 257/586 |
| 8,866,263 B2 | 10/2014 | Denison |

(Continued)

OTHER PUBLICATIONS

Denison et al., "25V ESD NPN Transistor Optimized By Distributed Emitter Ballasting Using Emitter Contact Area Segmentation," IEEE, 2007, pp. 604-605.
Green et al., "Performance Analysis of the Segment npn Anode LIGBT," IEEE Transactions on Electron Devices, vol. 52, No. 11, 2005, pp. 2482-2488.
Liu et al., "Novel Silicon-Controlled Rectifier (SCR) for High-Voltage Electrostatic Discharge (ESD) Applications," IEEE Electron Device Letters, vol. 29, No. 7, 2008, pp. 753-755.

(Continued)

*Primary Examiner* — Natalia A Gondarenko
(74) *Attorney, Agent, or Firm* — Francois Pagette; Hoffman Warnick LLC

(57) ABSTRACT

Disclosed semiconductor structure embodiments include a bipolar junction device configured to have a high holding voltage. The device includes base, collector and emitter terminals. The high holding voltage is achieved because of a uniquely configured emitter terminal. Specifically, the device includes a base well region, which has a first-type conductivity. The emitter terminal includes, adjacent to the base well region (e.g., within and/or on the base well region), an emitter contact region, which has a second-type conductivity, and an ancillary emitter region, which abuts the emitter contact region and which has the first-type conductivity at a higher conductivity level than the base well region. Embodiments vary with regard to the shapes of the emitter contact region and ancillary emitter region. Embodiments also vary with regard to the structures used to isolate the collector terminal from the emitter terminal and with regard to the areas covered by silicide layers.

20 Claims, 18 Drawing Sheets

(51) Int. Cl.
 *H01L 29/06* (2006.01)
 *H01L 29/08* (2006.01)
 *H01L 29/10* (2006.01)

(52) U.S. Cl.
 CPC ...... *H01L 29/0808* (2013.01); *H01L 29/0821* (2013.01); *H01L 29/1008* (2013.01)

(58) Field of Classification Search
 CPC ............... H01L 29/36; H01L 29/66272; H01L 21/02532; H01L 21/02579; H01L 21/0273; H01L 21/26513; H01L 21/266; H01L 21/76283; H01L 21/8222; H01L 21/8228; H01L 21/8249; H01L 21/84; H01L 2924/1305–13056; H01L 29/66234–66348; H01L 29/73–7378; H01L 29/732; H01L 29/739–7398; H01L 29/74; H01L 29/7424; H01L 29/7432; H01L 29/7436; H01L 29/083; H01L 29/0834; H01L 29/0839; H01L 29/0843; H01L 29/0865; H01L 29/0626; H01L 29/1012; H01L 29/1016; H01L 29/102; H01L 29/42308; H01L 29/66121; H01L 29/66128; H01L 29/66212; H01L 29/66356; H01L 29/66363; H01L 29/66371; H01L 29/66393
 USPC .......................... 257/584, 565, 546, 549, 362
 See application file for complete search history.

(56) References Cited

U.S. PATENT DOCUMENTS

| | | |
|---|---|---|
| 2004/0016992 A1* | 1/2004 | Mallikarjunaswamy ............... H01L 27/0262 257/362 |
| 2009/0212323 A1* | 8/2009 | Liu .............. H01L 29/87 257/E21.61 |
| 2010/0164012 A1* | 7/2010 | Yoon ............. H01L 21/8249 257/370 |
| 2012/0119331 A1 | 5/2012 | Gendron et al. |
| 2014/0231962 A1* | 8/2014 | Yoo ............. H01L 29/6625 438/335 |
| 2015/0021739 A1* | 1/2015 | Chen ............ H01L 29/735 257/565 |
| 2017/0092761 A1* | 3/2017 | Habenicht ........... H01L 29/0882 |
| 2017/0170304 A1* | 6/2017 | Kim ............ H01L 29/7322 |
| 2018/0247925 A1* | 8/2018 | Salman ............ H01L 27/0255 |
| 2021/0028300 A1 | 1/2021 | Yasuda |

OTHER PUBLICATIONS

Song et al., "Analysis of a Parasitic-Diode-Triggered Electrostatic Discharge Protection Circuit for 12V Applications," ETRI Journal, vol. 39, Issue 5, pp. 746-755.

Yoo et al., "P-type Isolated GGNMOS with a Deep Current Path for ESD Protection," Proceedings of the 23rd International Symposium on Power Semiconductor Devices and IC's, 2011, pp. 380-383.

* cited by examiner

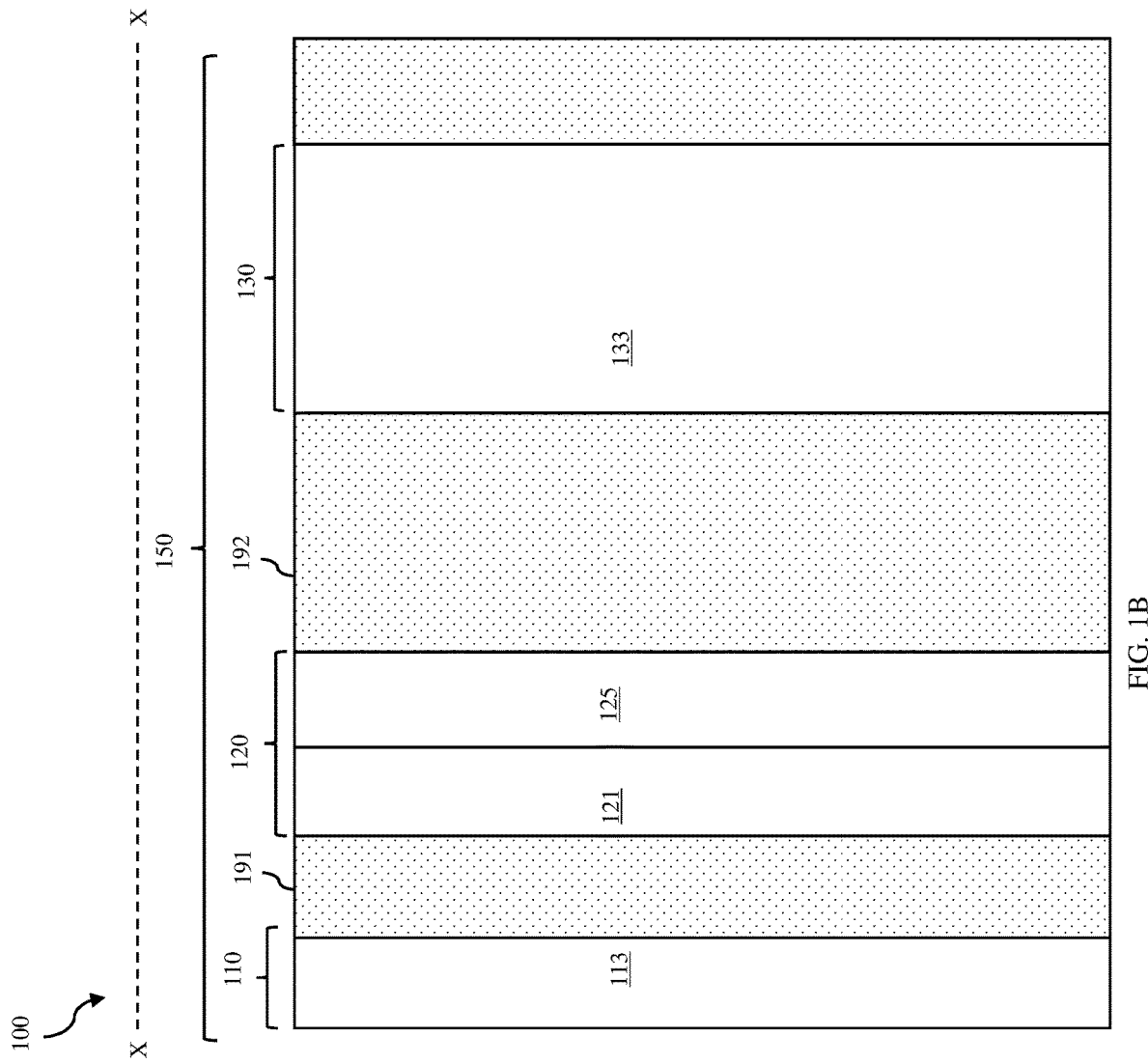

HIGH HOLDING VOLTAGE BIPOLAR JUNCTION DEVICE

BACKGROUND

Field of the Invention

The present invention relates to bipolar junction devices and, more particularly, bipolar junction devices having a high holding voltage.

Description of Related Art

In some technologies bipolar junction devices are not suitable for use as electrostatic discharge (ESD) devices due to limited holding voltage and/or failure current. It would be advantageous to provide a bipolar junction device configured to have a high holding voltage such that the device could be employed as an ESD device, which is suitable for use as an I/O clamp and also suitable for power pad protection.

SUMMARY

Disclosed herein are embodiments of a structure. The structure can include a semiconductor substrate having a first surface and a second surface opposite the first surface. The structure can further include a device (e.g., a bipolar junction device). The device can include a base well region within the semiconductor substrate and a base contact region adjacent to the base well region at the second surface of the semiconductor substrate. The base well region and the base contact region can have a first-type conductivity. The device can further include an emitter contact region adjacent to the base well region at the second surface of the semiconductor substrate, but separated from the base contact region by an isolation region. The emitter contact region can have a second-type conductivity that is different from the first-type conductivity. The device can further include an ancillary emitter region, which is adjacent to the base well region at the second surface of the semiconductor substrate, which is immediately adjacent to the emitter contact region, and which has the first-type conductivity.

In some of the disclosed embodiments of the structure, the emitter contact region and the ancillary emitter region can both be segmented. Specifically, some embodiments of the structure can include a semiconductor substrate having a first surface and a second surface opposite the first surface. The structure can also include a device (e.g., a bipolar junction device). The device can include a base well region within the semiconductor substrate and a base contact region adjacent to the base well region at the second surface of the semiconductor substrate. The base well region and the base contact region can both have a first-type conductivity. The device can further include an emitter contact region adjacent to the base well region at the second surface of the semiconductor substrate, but separated from the base contact region by an isolation region. The emitter contact region can be made up of discrete emitter contact region segments, which have a second-type conductivity that is different from the first-type conductivity. The device can further include an ancillary emitter region adjacent to the base well region at the second surface of the semiconductor substrate and also separated from the base contact region by the isolation region. The ancillary emitter region can be made up of discrete ancillary emitter region segments with the first-type conductivity and the emitter contact region segments and the ancillary contact region segments can alternate across the width of the device.

In some of the disclosed embodiments, the ancillary emitter region can be essentially comb-shaped. Specifically, some embodiments of the structure can include a semiconductor substrate having a first surface and a second surface opposite the first surface. The structure can further include a device (e.g., a bipolar junction device). The device can include a base well region within the semiconductor substrate and a base contact region adjacent to the base well region at the second surface of the semiconductor substrate. The base well region and the base contact region can have a first-type conductivity. The device can further include an emitter contact region adjacent to the base well region at the second surface of the semiconductor substrate, but separated from the base contact region by an isolation region. The emitter contact region can have a second-type conductivity that is different from the first-type conductivity. The device can further include an ancillary emitter region, which is adjacent to the base well region at the second surface of the semiconductor substrate and which has the first-type conductivity. The ancillary emitter region can specifically be essentially comb-shaped. That is, it can include an ancillary emitter region body, which extends laterally across the width of the device, and ancillary emitter region extensions, which are oriented essentially perpendicular to the ancillary emitter region body and which extend laterally toward and are immediately adjacent to the emitter contact region.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1A and 1B are different cross-section diagrams illustrating an embodiment of a semiconductor structure including a bipolar junction device configured to have a high holding voltage;

DETAILED DESCRIPTION

Figure 1A:
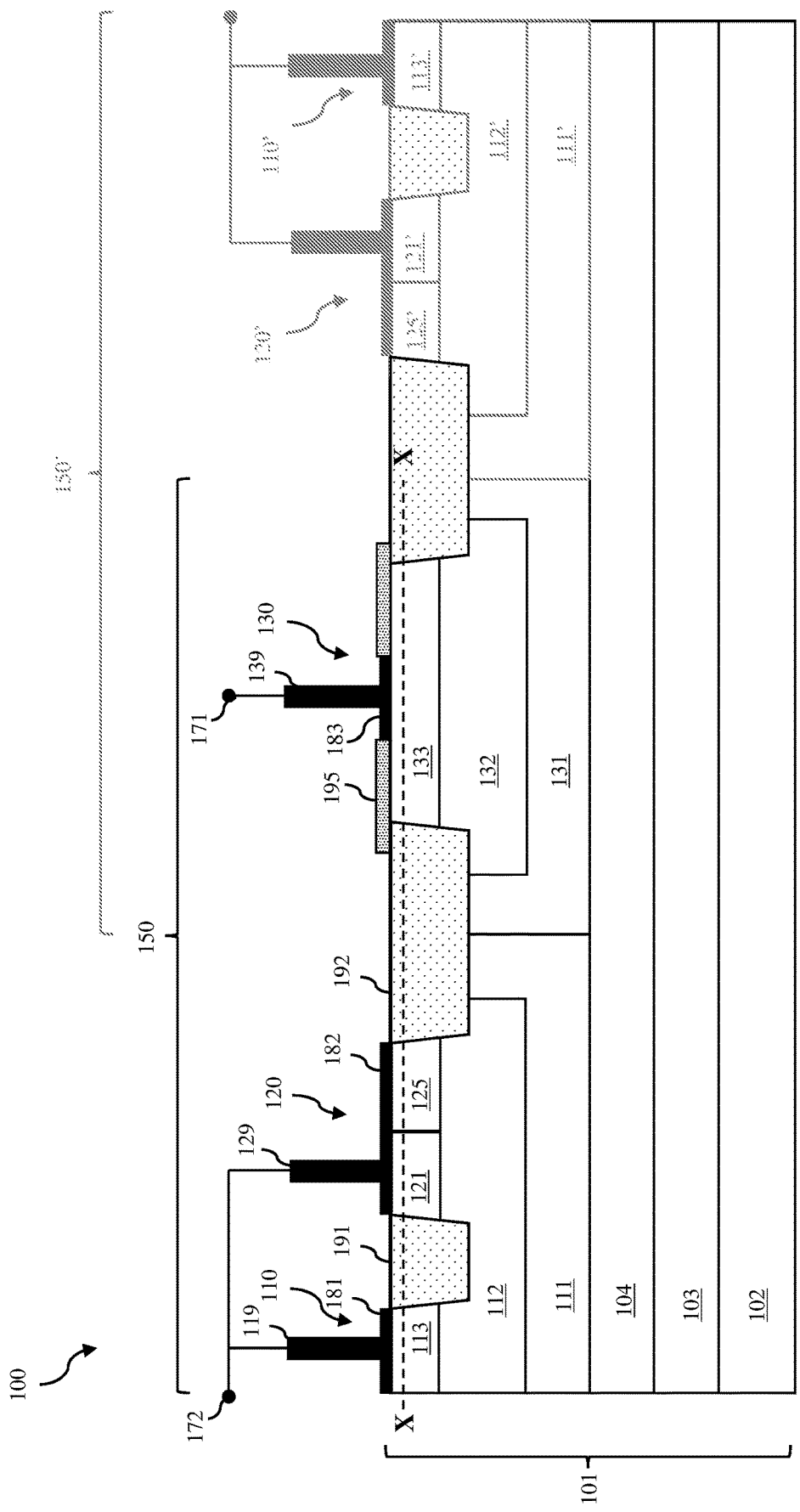

As mentioned above, in some technologies bipolar junction devices are not suitable for use as electrostatic discharge (ESD) devices due to limited holding voltage and/or failure current.

In view of the foregoing, disclosed herein are embodiments of a semiconductor structure including a bipolar junction device that is configured so as to have a high holding voltage such that it can be employed as an electrostatic discharge (ESD) device, which is suitable for use as an I/O clamp and also suitable for power pad protection. The bipolar junction device is made up of various in-substrate doped regions and, optionally, semiconductor layers that form base, collector and emitter terminals (as discussed in greater detail below). The high holding voltage is achieved because of a uniquely configured emitter terminal. Specifically, the device can include a base well region, which has a first-type conductivity. The emitter terminal can include, adjacent to the base well region (e.g., within and/or on the base well region), an emitter contact region, which has a second-type conductivity, and an ancillary emitter region, which abuts the emitter contact region and which has the first-type conductivity at a higher conductivity level than the base well region. Embodiments can vary with regard to the shapes of the emitter contact region and ancillary emitter region. For example, in some embodiments, they can both extend across the full width of the device. In other embodiments, they can both be segmented with segments having different type conductivities alternating across the width of the device. In still other embodiments, the ancillary emitter region be comb-shaped with a body portion extending across the width of the device and with extension portions perpendicular to the body portion and either extending between discrete segments of a segmented emitter contact region or extending between extensions portions of a comb-shaped emitter contact region. Embodiments can also vary with regard to the structures used to isolate the collector terminal from the emitter terminal and with regard to the areas covered by silicide layers.

More particularly, referring to FIGS. 1A-1B, 2A-2B, 3A-3B, 4A-4B, 5A-5B, 6A-6B, 7A-7B, and 8A-8B, disclosed herein are embodiments of a semiconductor structure 100, 200, 300, 400, 500, 600, 700, and 800, respectively, including a bipolar junction device 150, 250, 350, 450, 550, 650, 750, 850 that is configured so as to have a high holding voltage such that it can be employed as an electrostatic discharge (ESD) device, which is suitable for use as an I/O clamp and also suitable for power pad protection.

The bipolar junction device 150, 250, 350, 450, 550, 650, 750, 850 can be an NPN device. Alternatively, the bipolar junction device 150, 250, 350, 450, 550, 650, 750, 850 could be a PNP device. In the discussion below, reference is made to semiconductor regions and/or layers being doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the bipolar junction device is an NPN device or a PNP device. Specifically, if the bipolar junction device is an NPN device, then the first-type conductivity refers to P-type conductivity and the second-type conductivity refers to N-type conductivity. However, if the bipolar junction device is a PNP device, then the first-type conductivity refers to N-type conductivity and the second-type conductivity refers to P-type conductivity. See the detailed discussion below regarding different dopants that can be employed in semiconductor materials to achieve P-type conductivity or N-type conductivity.

The semiconductor structure 100, 200, 300, 400, 500, 600, 700, 800 can include a monocrystalline semiconductor substrate 101, 201, 301, 401, 501, 601, 701, 801. This monocrystalline semiconductor substrate can be, for example, a bulk silicon substrate with a bottom surface (referred to herein as a first surface) and a top surface (referred to herein as a second surface) opposite the bottom surface (as illustrated).

The semiconductor substrate 101, 201, 301, 401, 501, 601, 701, 801 can have a lower portion 102, 202, 302, 402, 502, 602, 702, 802 adjacent to the bottom surface and doped so as to have a first-type conductivity at a relatively low conductivity level. For example, when the bipolar junction device 150, 250, 350, 450, 550, 650, 750, 850 is an NPN device, the lower portion 102, 202, 302, 402, 502, 602, 702, 802 can have P− conductivity.

The semiconductor substrate 101, 201, 301, 401, 501, 601, 701, 801 can further include a first buried well region 103, 203, 303, 403, 503, 603, 703, 803 within the substrate above the lower portion 102, 202, 302, 402, 502, 602, 702, 802, physically separated from the top surface of the semiconductor substrate, and doped so as to have a second-type conductivity at a relatively low conductivity level. For example, when the bipolar junction device 150, 250, 350, 450, 550, 650, 750, 850 is an NPN device, the first buried well region 103, 203, 303, 403, 503, 603, 703, 803 can be an N− buried well region (also referred to as an HVDNW).

The semiconductor substrate 101, 201, 301, 401, 501, 601, 701, 801 can further include a second buried well region 104, 204, 304, 404, 504, 604, 704, 804 within the substrate above the first buried well region 103, 203, 303, 403, 503, 603, 703, 803, physically separated from the top surface of the semiconductor substrate, and doped so as to have the first-type conductivity at a relatively low conductivity level but at a higher conductivity level than the lower portion 102, 202, 302, 402, 502, 602, 702, 802 of the substrate. For example, when the bipolar junction device 150, 250, 350, 450, 550, 650, 750, 850 is an NPN device, the second buried well region 104, 204, 304, 404, 504, 604, 704, 804 can be a P− buried well region (also referred to as a PWHV).

The semiconductor structure 100, 200, 300, 400, 500, 600, 700, 800 can further include the bipolar junction device 150, 250, 350, 450, 550, 650, 750, 850. This device 150, 250, 350, 450, 550, 650, 750, 850 can be a three-terminal device including: a base terminal 110, 210, 310, 410, 510, 610, 710, 810, a collector terminal 130, 230, 330, 430, 530, 630, 730, 830, and an emitter terminal 120, 220, 320, 420, 520, 620, 720, 820.

The base terminal 110, 210, 310, 410, 510, 610, 710, 810 can include a base well region 111, 211, 311, 411, 511, 611, 711, 811, which is within the substrate, which extends from the top surface of the substrate to the second buried well region 104, 204, 304, 404, 504, 604, 704, 804, and which has the first-type conductivity at a higher conductivity level than that the second buried well region 104, 204, 304, 404, 504, 604, 704, 804. For example, when the bipolar junction device 150, 250, 350, 450, 550, 650, 750, 850 is an NPN device, the base well region 111, 211, 311, 411, 511, 611, 711, 811 can be a Pwell region (also referred to as a HVPDDD_D).

Optionally, the base terminal 110, 210, 310, 410, 510, 610, 710, 810 can include an additional base well region 112, 212, 312, 412, 512, 612, 712, 812, which is within the substrate and, particularly, within the base well region 111, 211, 311, 411, 511, 611, 711, 811 and which is shallower than the base well region 111, 211, 311, 411, 511, 611, 711, 811. That is, the additional base well region 112, 212, 312, 412, 512, 612, 712, 812 can extend from the top surface of the substrate to some depth above the level of the top of the second buried well region 104, 204, 304, 404, 504, 604, 704, 804 such that the bottom of the additional base well region is above the level of the bottom of the base well region. The additional base well region 112, 212, 312, 412, 512, 612, 712, 812 can also be narrower than the base well region 111, 211, 311, 411, 511, 611, 711, 811. That is, the additional base well region 112, 212, 312, 412, 512, 612, 712, 812 can be within the base well region 111, 211, 311, 411, 511, 611, 711, 811 such that sides of the additional base well region are separated from sides of the base well region by some distance. In any case, the additional base well region 112, 212, 312, 412, 512, 612, 712, 812 can have the first-type conductivity at a higher conductivity level than the base well region 111, 211, 311, 411, 511, 611, 711, 811. For example, when the bipolar junction device 150, 250, 350, 450, 550, 650, 750, 850 is an NPN device, the additional base well region 112, 212, 312, 412, 512, 612, 712, 812 can, like the base well region, be a Pwell region (also referred to as MVPSD) but at a higher P-type conductivity level.

The base terminal 110, 210, 310, 410, 510, 610, 710, 810 can further include a base contact region 113, 213, 313, 413, 513, 613, 713, 813, which is adjacent to the base well region 111, 211, 311, 411, 511, 611, 711, 811 (and if applicable to the additional base well region 112, 212, 312, 412, 512, 612, 712, 812 therein) at the top surface of the substrate. For example, the base contact region 113, 213, 313, 413, 513, 613, 713, 813 can be a shallow dopant implant region within the substrate at the top surface. Alternatively, the base contact region 113, 213, 313, 413, 513, 613, 713, 813 can be a doped monocrystalline semiconductor layer (e.g., an in-situ doped epitaxially silicon layer or an in situ doped epitaxial layer of some other suitable semiconductor material) immediately adjacent to the top surface of the semiconductor substrate aligned above and in contact with the base well region (and if applicable aligned above and in contact with the additional base well region). In any case, the base contact region 113, 213, 313, 413, 513, 613, 713, 813 can have the first-type conductivity at a higher first-type conductivity level than the optional additional base well region. Thus, the first-type conductivity level is graded and, particularly, increases from the second buried well region through the base well region and the additional base well region (if applicable) to the base contact region. For example, when the bipolar junction device 150, 250, 350, 450, 550, 650, 750, 850 is an NPN device, the base contact region 113, 213, 313, 413, 513, 613, 713, 813 can be a P+ base contact region and the P-type conductivity level can be graded and, particularly, can increase from the buried Pwell, through the base Pwell and the additional base Pwell (if applicable) to the P+ base contact region.

The emitter terminal 120, 220, 320, 420, 520, 620, 720, 820 can include an emitter contact region 121, 221, 321, 421, 521, 621, 721, 821, which is adjacent to (e.g., within or on) the base well region 111, 211, 311, 411, 511, 611, 711, 811 (or if applicable the additional base well region 112, 212, 312, 412, 512, 612, 712, 812 therein) at the second surface of the substrate. For example, the emitter contact region 121, 221, 321, 421, 521, 621, 721, 821 can be a shallow dopant implant region within the substrate at the top surface. Alternatively, the emitter contact region 121, 221, 321, 421, 521, 621, 721, 821 can be a doped monocrystalline semiconductor layer (e.g., an in-situ doped epitaxially silicon layer or an in situ doped epitaxial layer of some other suitable semiconductor material) immediately adjacent to the top surface of the semiconductor substrate aligned above and in contact with the base well region (and if applicable aligned above and in contact with the additional base well region). In any case, the emitter contact region 121, 221, 321, 421, 521, 621, 721, 821 can have the second-type conductivity at a relatively high conductivity level and, particularly, at a higher second-type conductivity level than the first buried well region 103, 203, 303, 403, 503, 603, 703, 803. For example, when the bipolar junction device 150, 250, 350, 450, 550, 650, 750, 850 is an NPN device, the emitter contact region 121, 221, 321, 421, 521, 621, 721, 821 can be an N+ emitter contact region.

It should be noted that an isolation region 191, 291, 391, 491, 591, 691, 791, 891 can be within the base well region 111, 211, 311, 411, 511, 611, 711, 811 (or if applicable the additional base well region 112, 212, 312, 412, 512, 612, 712, 812 therein) positioned laterally between and abutting the base contact region 113, 213, 313, 413, 513, 613, 713, 813 and the emitter contact region 121, 221, 321, 421, 521, 621, 721, 821. This isolation region 191, 291, 391, 491, 591, 691, 791, 891 can, for example, be a shallow trench isolation (STI) region, as illustrated, or, alternatively, a local oxidation of silicon (LOCOS) region. In any case, the isolation region can, for example, extend into the substrate to a depth that is below the level of the bottoms of the base contact region 113, 213, 313, 413, 513, 613, 713, 813 and the emitter contact region 121, 221, 321, 421, 521, 621, 721, 821 and above the level of the bottom of the base well region (and if applicable the additional base well region).

The emitter terminal 120, 220, 320, 420, 520, 620, 720, 820 can further include an ancillary emitter region 125, 225, 325, 425, 525, 625, 725, 825, which is adjacent to (e.g., within or on) the base well region 111, 211, 311, 411, 511, 611, 711, 811 (or if applicable the additional base well region 112, 212, 312, 412, 512, 612, 712, 812 therein) at the second surface of the substrate. For example, the ancillary emitter region 125, 225, 325, 425, 525, 625, 725, 825 can be a shallow dopant implant region within the substrate at the top surface. Alternatively, the ancillary emitter region 125, 225, 325, 425, 525, 625, 725, 825 can be a doped monocrystalline semiconductor layer (e.g., an in-situ doped epitaxially silicon layer or an in situ doped epitaxial layer of some other suitable semiconductor material) immediately adjacent to the top surface of the semiconductor substrate aligned above and in contact with the base well region (and if applicable aligned above and in contact with the additional base well region). In any case, the ancillary emitter region 125, 225, 325, 425, 525, 625, 725, 825 can have the first-type conductivity at a relatively high first-type conductivity level (e.g., at the same level as the base contact region 113, 213, 313, 413, 513, 613, 713, 813 and at a higher level than the additional base well region (if applicable) and the base well region) and can be immediately adjacent to the emitter contact region 121, 221, 321, 421, 521, 621, 721, 821. For example, when the bipolar junction device 150, 250, 350, 450, 550, 650, 750, 850 is an NPN device, the ancillary emitter region 125, 225, 325, 425, 525, 625, 725, 825 can be a P+ ancillary emitter region immediately adjacent to the N+ emitter contact region.

The collector terminal 130, 230, 330, 430, 530, 630, 730, 830 can include a collector well region 131, 231, 331, 431, 531, 631, 731, 831, which is within the substrate and positioned laterally immediately adjacent to the base well region 111, 211, 311, 411, 511, 611, 711, 811, which extends from the top surface of the substrate to the second buried well region 104, 204, 304, 404, 504, 604, 704, 804, and which has the second-type conductivity at a higher conductivity level than that the first buried well region 103, 203, 303, 403, 503, 603, 703, 803. For example, when the bipolar junction device 150, 250, 350, 450, 550, 650, 750, 850 is an NPN device, the collector well region 131, 231, 331, 431, 531, 631, 731, 831 can be an Nwell region (also referred to as a HVNDDD).

Optionally, the collector terminal 130, 230, 330, 430, 530, 630, 730, 830 can include an additional collector well region 132, 232, 332, 432, 532, 632, 732, 832, which is within the substrate and, particularly, within the collector well region 131, 231, 331, 431, 531, 631, 731, 831 and which is shallower than the collector well region 131, 231, 331, 431, 531, 631, 731, 831. That is, the additional collector well region 132, 232, 332, 432, 532, 632, 732, 832 can extend from the top surface of the substrate to some depth above the level of the top of the second buried well region 104, 204, 304, 404, 504, 604, 704, 804 such that the bottom of the additional collector well region is above the level of the bottom of the collector well region. The additional collector well region 132, 232, 332, 432, 532, 632, 732, 832 can also be narrower than the collector well region 131, 231, 331, 431, 531, 631, 731, 831. That is, the additional collector well region 132, 232, 332, 432, 532, 632, 732, 832 can be within the collector well region 131, 231, 331, 431, 531, 631, 731, 831 such that sides of the additional collector well region are separated from sides of the collector well region by some distance. In any case, the additional collector well region 132, 232, 332, 432, 532, 632, 732, 832 can have the second-type conductivity at a higher conductivity level than the collector well region 131, 231, 331, 431, 531, 631, 731, 831. For example, when the bipolar junction device 150, 250, 350, 450, 550, 650, 750, 850 is an NPN device, the additional collector well region 132, 232, 332, 432, 532, 632, 732, 832 can, like the collector well region, be an Nwell region (also referred to as NW) but at a higher N-type conductivity level.

The collector terminal 130, 230, 330, 430, 530, 630, 730, 830 can further include a collector contact region 133, 233, 333, 433, 533, 633, 733, 833, which is adjacent to the collector well region 131, 231, 331, 431, 531, 631, 731, 831 (and if applicable to the additional collector well region 132, 232, 332, 432, 532, 632, 732, 832 therein) at the top surface of the substrate. For example, the collector contact region 133, 233, 333, 433, 533, 633, 733, 833 can be a shallow dopant implant region within the substrate at the top surface. Alternatively, the collector contact region 133, 233, 333, 433, 533, 633, 733, 833 can be a doped monocrystalline semiconductor layer (e.g., an in-situ doped epitaxially silicon layer or an in situ doped epitaxial layer of some other suitable semiconductor material) immediately adjacent to the top surface of the semiconductor substrate aligned above and in contact with the collector well region (and if applicable aligned above and in contact with the additional collector well region). In any case, the collector contact region 133, 233, 333, 433, 533, 633, 733, 833 can have the second-type conductivity at a higher second-type conductivity level than the optional additional collector well region. Thus, the second-type conductivity level is graded and, particularly, increases from the collector well region and through the additional collector well region (if applicable) to the collector contact region. For example, when the bipolar junction device 150, 250, 350, 450, 550, 650, 750, 850 is an NPN device, the collector contact region 133, 233, 333, 433, 533, 633, 733, 833 can be an N+ collector contact region and the N-type conductivity level can be graded and, particularly, can increase from the collector Nwell through the additional collector Nwell (if applicable) to the N+ collector contact region.

The above-described semiconductor structure embodiments can vary with regard to the shapes and relative positioning of the emitter contact region 121, 221, 321, 421, 521, 621, 721, 821 and ancillary emitter region 125, 225, 325, 425, 525, 625, 725, 825.

Figure 5A:
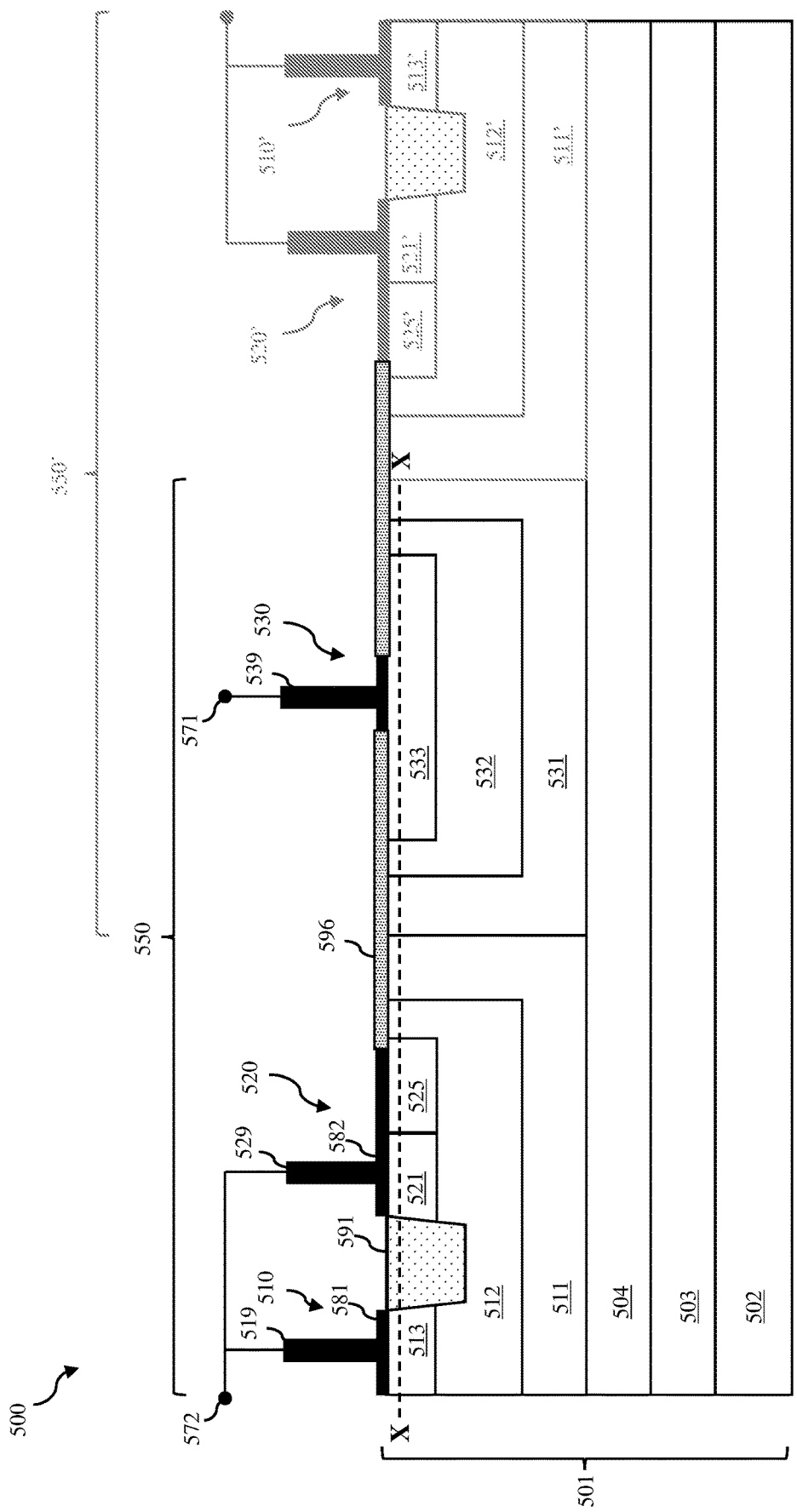
FIGS. 5A and 5B are different cross-section diagrams illustrating an embodiment of a semiconductor structure including a bipolar junction device configured to have a high holding voltage.
Figure 5B:
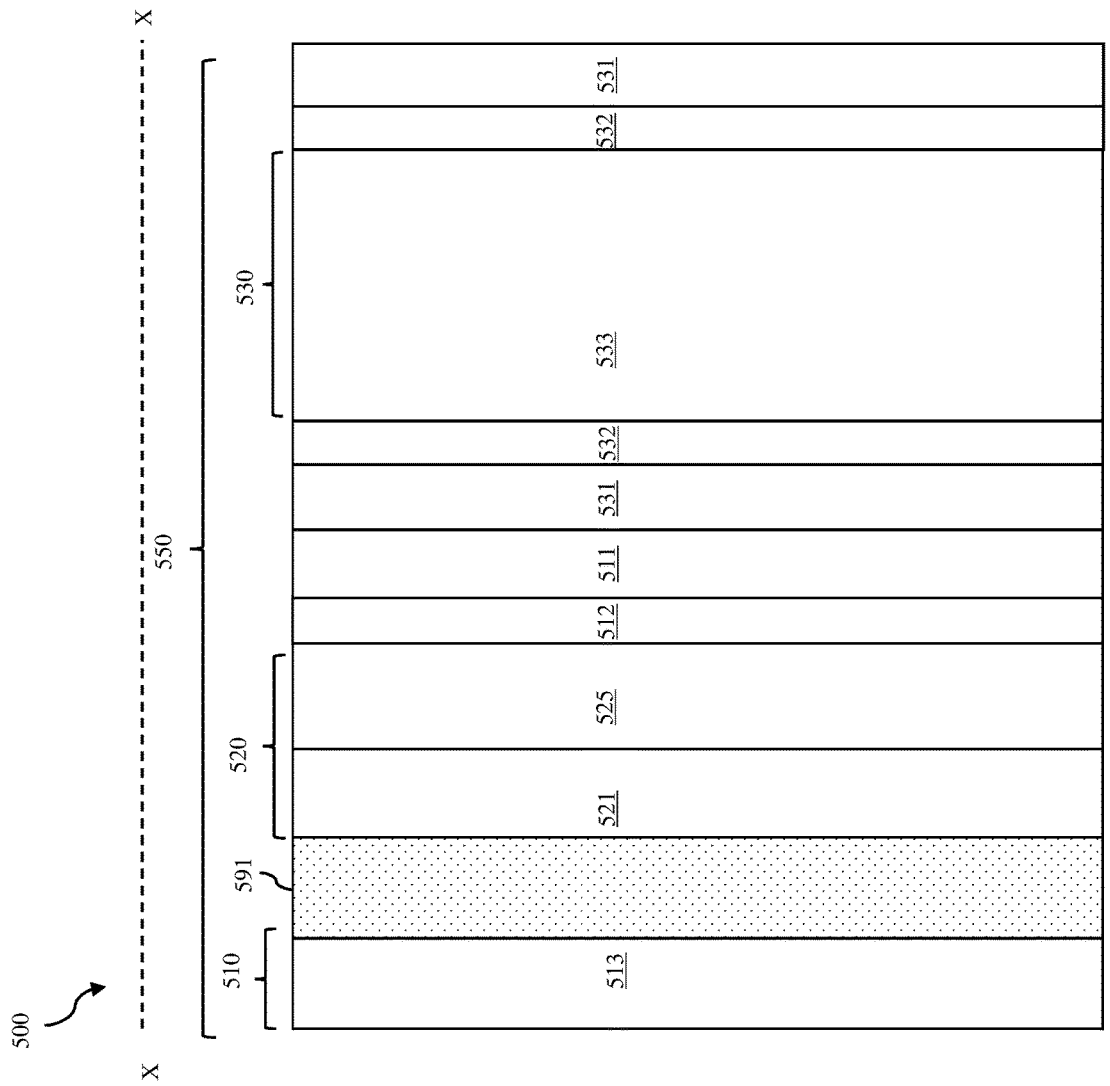

For example, in the bipolar junction device 150 of the semiconductor structure 100 of FIGS. 1A-1B and in the bipolar junction device 550 of the semiconductor structure 500 of FIGS. 5A-5B, the emitter contact region 121, 521 and ancillary emitter region 125, 525 can be essentially parallel rectangular-shaped regions that extend across the full width of the device 150, 550. In these embodiments, as shown in FIG. 1B and FIG. 5B, the emitter contact region 121, 521 can be parallel and immediately adjacent to the isolation region 191, 591 and the ancillary emitter region 125, 525 can be parallel and immediately adjacent to the emitter contact region 121, 521. Thus, the isolation region 191, 591 is positioned laterally between and parallel to the base contact region 113, 513 and the emitter contact region 121, 521 and the emitter contact region 121, 521 is positioned laterally between and parallel to the isolation region 191, 591 and the ancillary emitter region 125, 525.

Figure 2A:
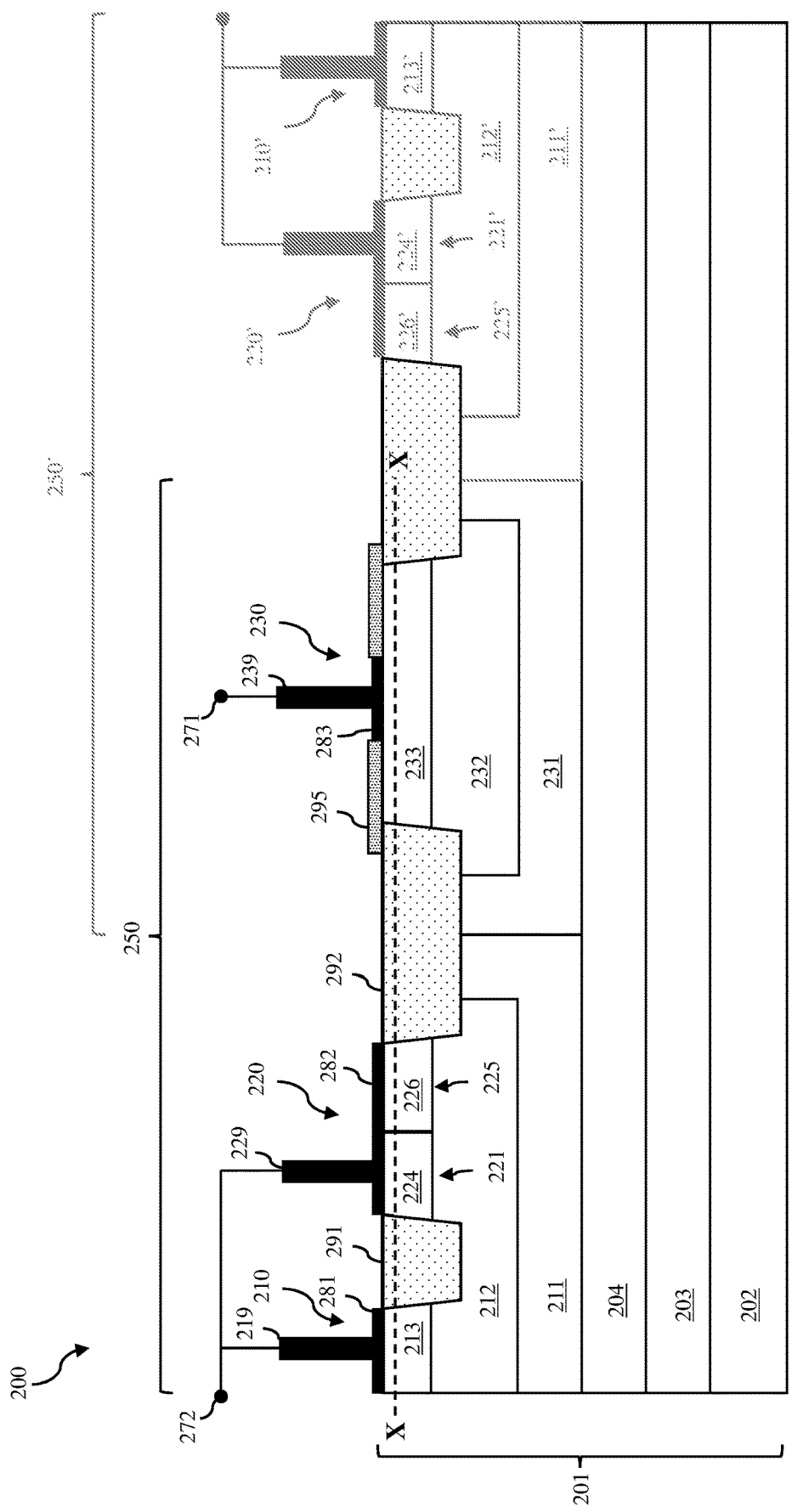
FIGS. 2A and 2B are different cross-section diagrams illustrating an embodiment of a semiconductor structure including a bipolar junction device configured to have a high holding voltage.
Figure 2B:
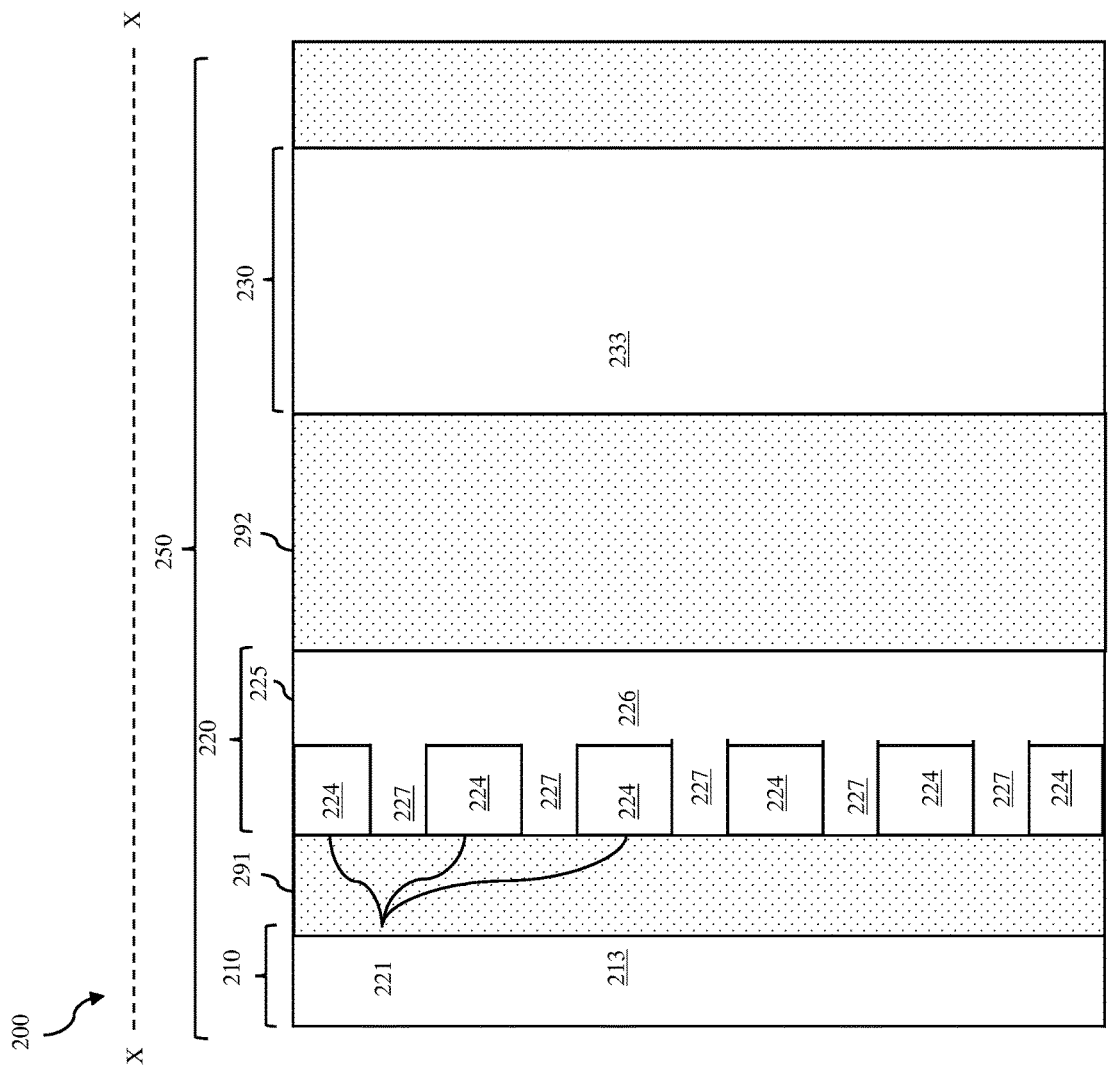
Figure 6A:
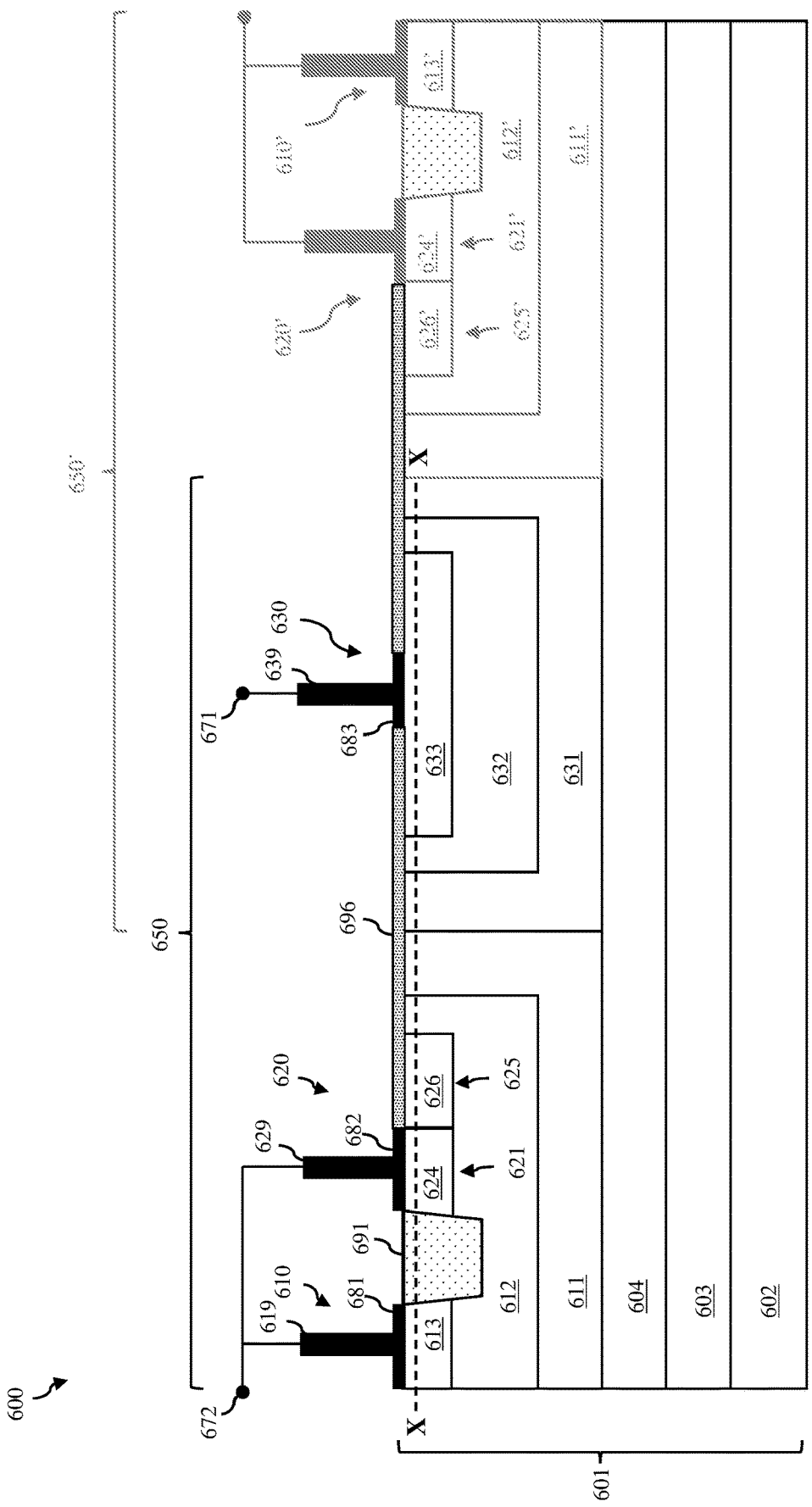
FIGS. 6A and 6B are different cross-section diagrams illustrating an embodiment of a semiconductor structure including a bipolar junction device configured to have a high holding voltage.
Figure 6B:
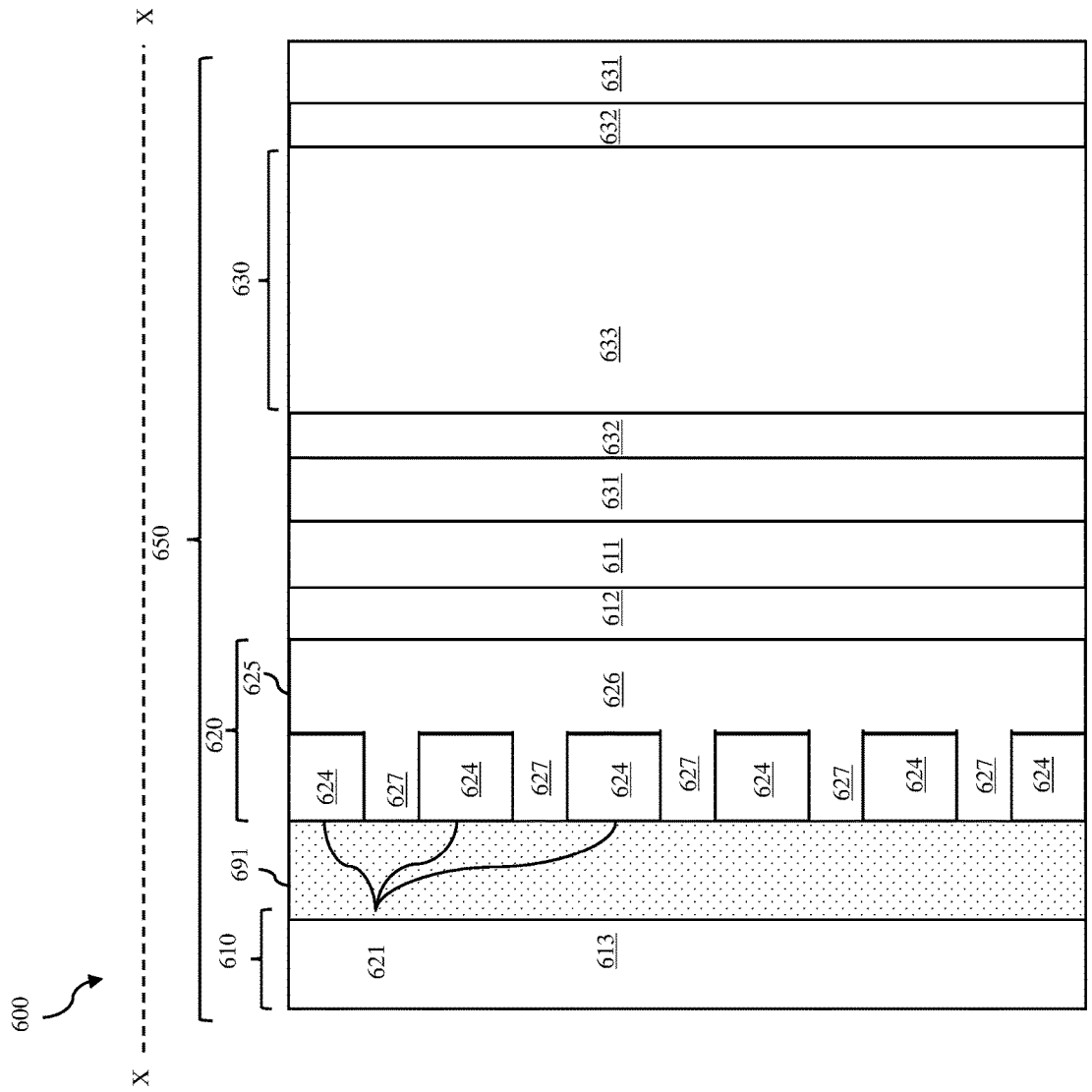

In the bipolar junction device 250 of the semiconductor structure 200 of FIGS. 2A-2B and in the bipolar junction device 650 of the semiconductor structure 600 of FIGS. 6A-6B, the emitter contact region 221, 621 can be segmented and the ancillary emitter region 225, 625 can be essentially comb-shaped. Specifically, the emitter contact region 221, 621 can include discrete emitter contact region segments 224, 624. The emitter contact region segments 224, 624 can be oriented in a line across the width of the device and physically separated from each other. Each emitter contact region segment 224, 624 can have a first end immediately adjacent to the isolation region 291, 691 and a second end opposite the first end such that each emitter contact region segment 224, 624 is oriented essentially perpendicular to the isolation region 291, 691 and further such that each emitter contact region segment 224, 624 is separated from the base contact region 213, 613 by the isolation region 291, 691. The ancillary emitter region 225, 625 can, as mentioned above, be essentially comb-shaped. That is, the ancillary emitter region 225, 625 can include an ancillary emitter region body 226, 626, which extends across the width of the device. The ancillary emitter region 225, 625 can further include ancillary emitter region extensions 227, 627. The ancillary emitter region extensions 227, 627 can extend laterally from the ancillary emitter region body 226, 626 to the isolation region 291, 691 (i.e., the ancillary emitter region extensions 227, 627 can be essentially perpendicular to and extend laterally between the ancillary emitter region body 226, 626 and the isolation region 291, 691) such that they are separated from the base contact region 213, 613 by the isolation region 291, 691. Furthermore, the ancillary emitter region extensions 227, 627 can be positioned on either side and immediately adjacent to the emitter contact region segments 224, 624 such that the ancillary emitter region extensions and the emitter contact region segments alternate across the width of the device.

Figure 3A:
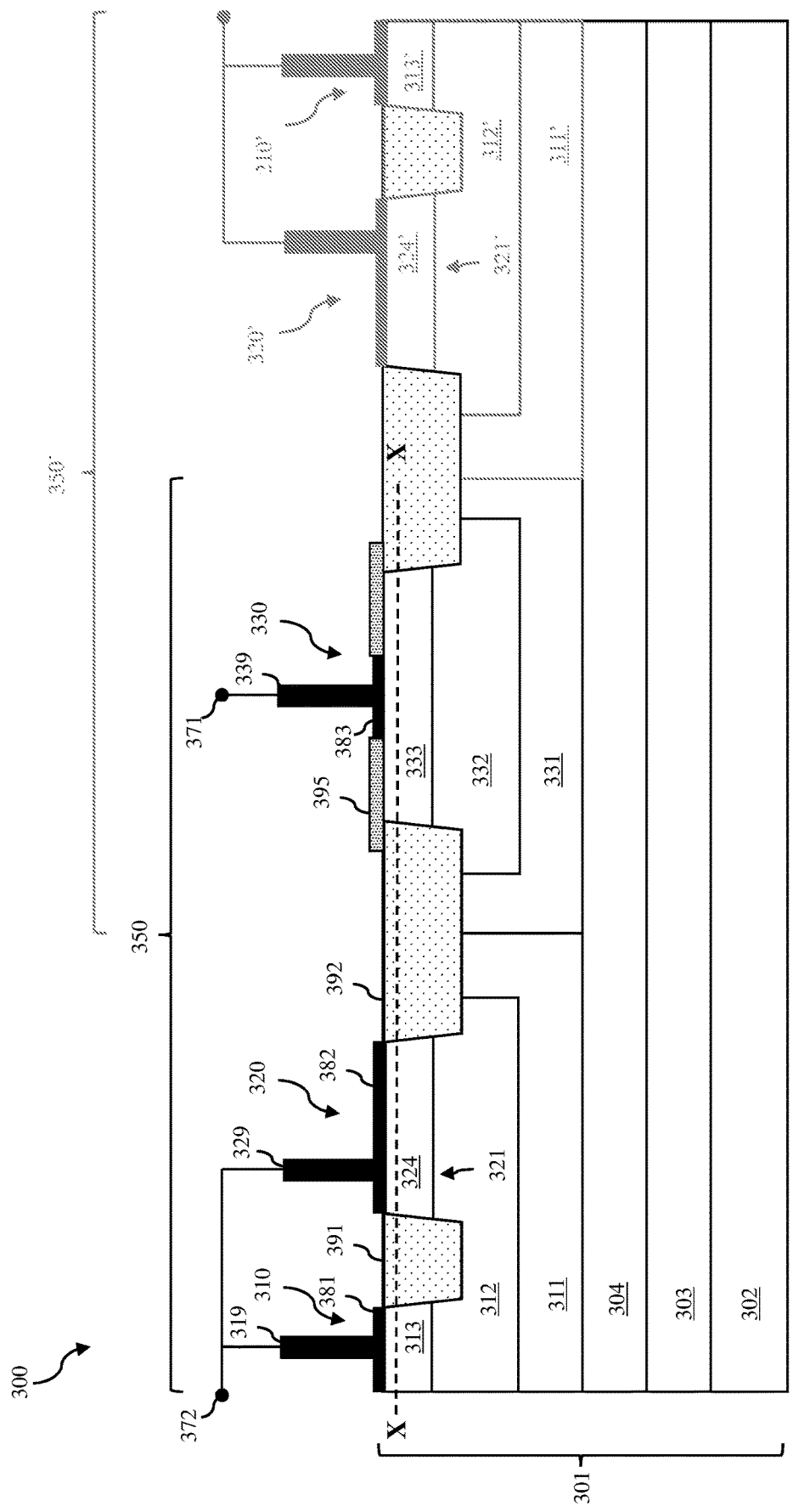
FIGS. 3A and 3B are different cross-section diagrams illustrating an embodiment of a semiconductor structure including a bipolar junction device configured to have a high holding voltage.
Figure 3B:
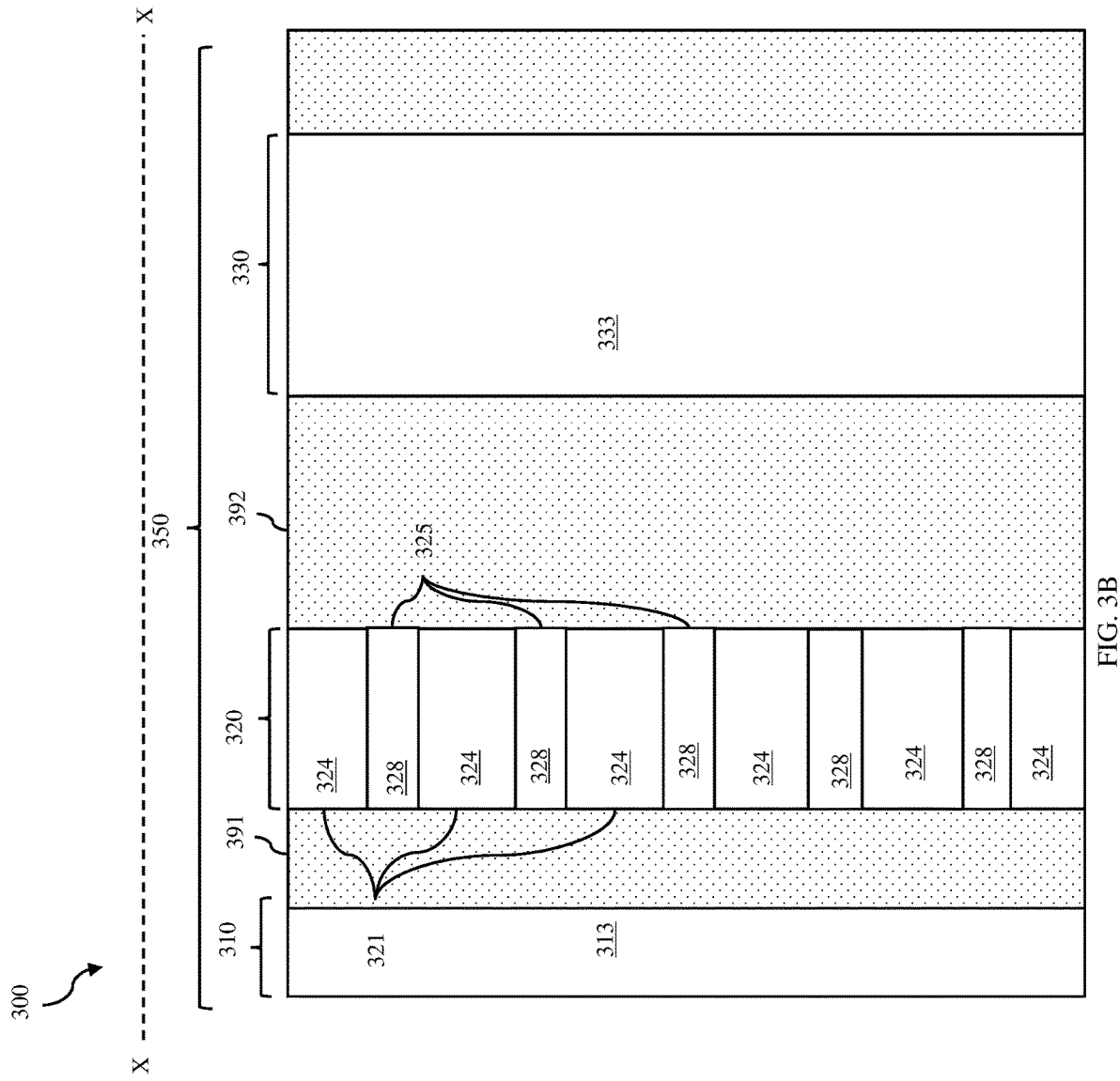
Figure 7A:
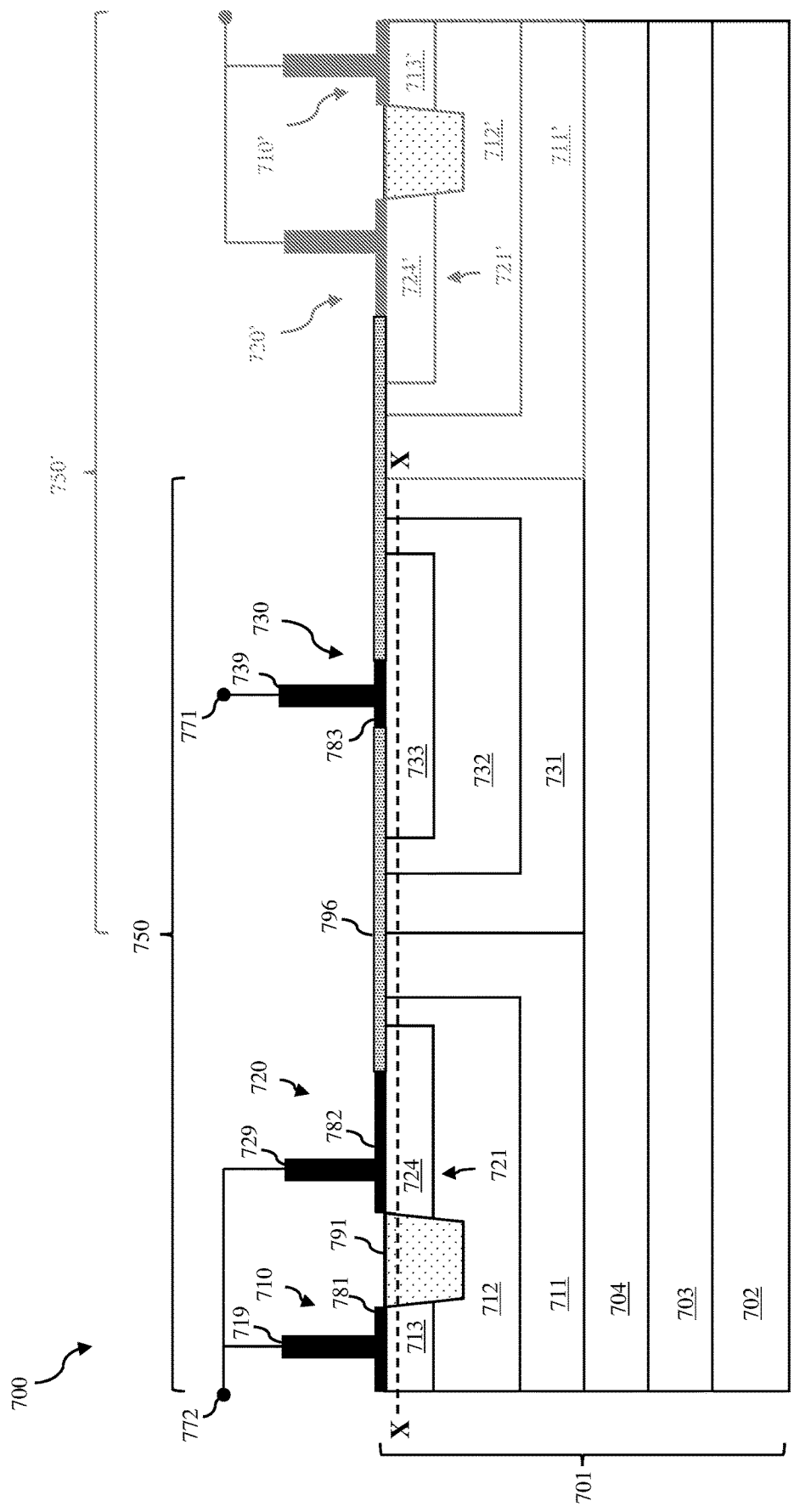
FIGS. 7A and 7B are different cross-section diagrams illustrating an embodiment of a semiconductor structure including a bipolar junction device configured to have a high holding voltage.
Figure 7B:
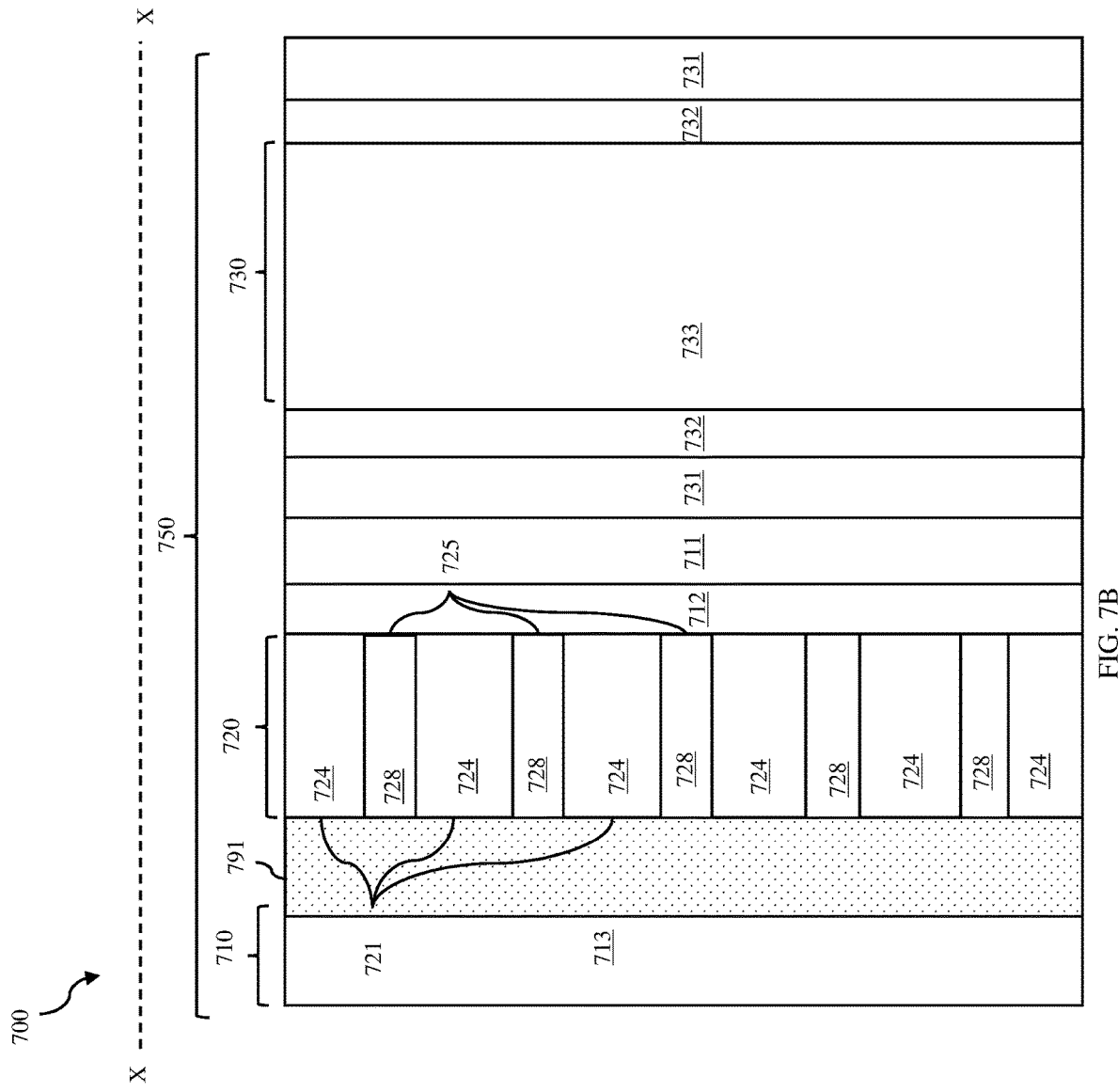

In the bipolar junction device 350 of the semiconductor structure 300 of FIGS. 3A-3B and in the bipolar junction device 750 of the semiconductor structure 700 of FIGS. 7A-7B, the emitter contact region 321, 721 and ancillary emitter region 325, 725 can both be segmented. Specifically, the emitter contact region 321, 721 can include discrete emitter contact region segments 324, 724. The emitter contact region segments 324, 724 can be oriented in a line across the width of the device and physically separated from each other. Each emitter contact region segment 324, 724 can have a first end immediately adjacent to the isolation region 391, 791 and a second end opposite the first end such that each emitter contact region segment 324, 724 is oriented essentially perpendicular to the isolation region 391, 791 and further such that each emitter contact region segment 324, 724 is separated from the base contact region 313, 713 by the isolation region 391, 791. The ancillary emitter region 325, 725 can include discrete ancillary emitter region segments 328, 728. The ancillary emitter region segments 328, 728 can be oriented in the same line as the emitter contact region segments and the different segments can alternate across the width of the device (e.g., each ancillary emitter region segment can be positioned laterally between and immediately adjacent to a pair of emitter contact region segments). Each ancillary emitter region segment 328, 728 can have a first end immediately adjacent to the isolation region 391, 791 and a second end opposite the first end such that it is perpendicular to the isolation region 391, 791 and further separated from the base contact region 313, 713 by the isolation region 391, 791.

Figure 4A:
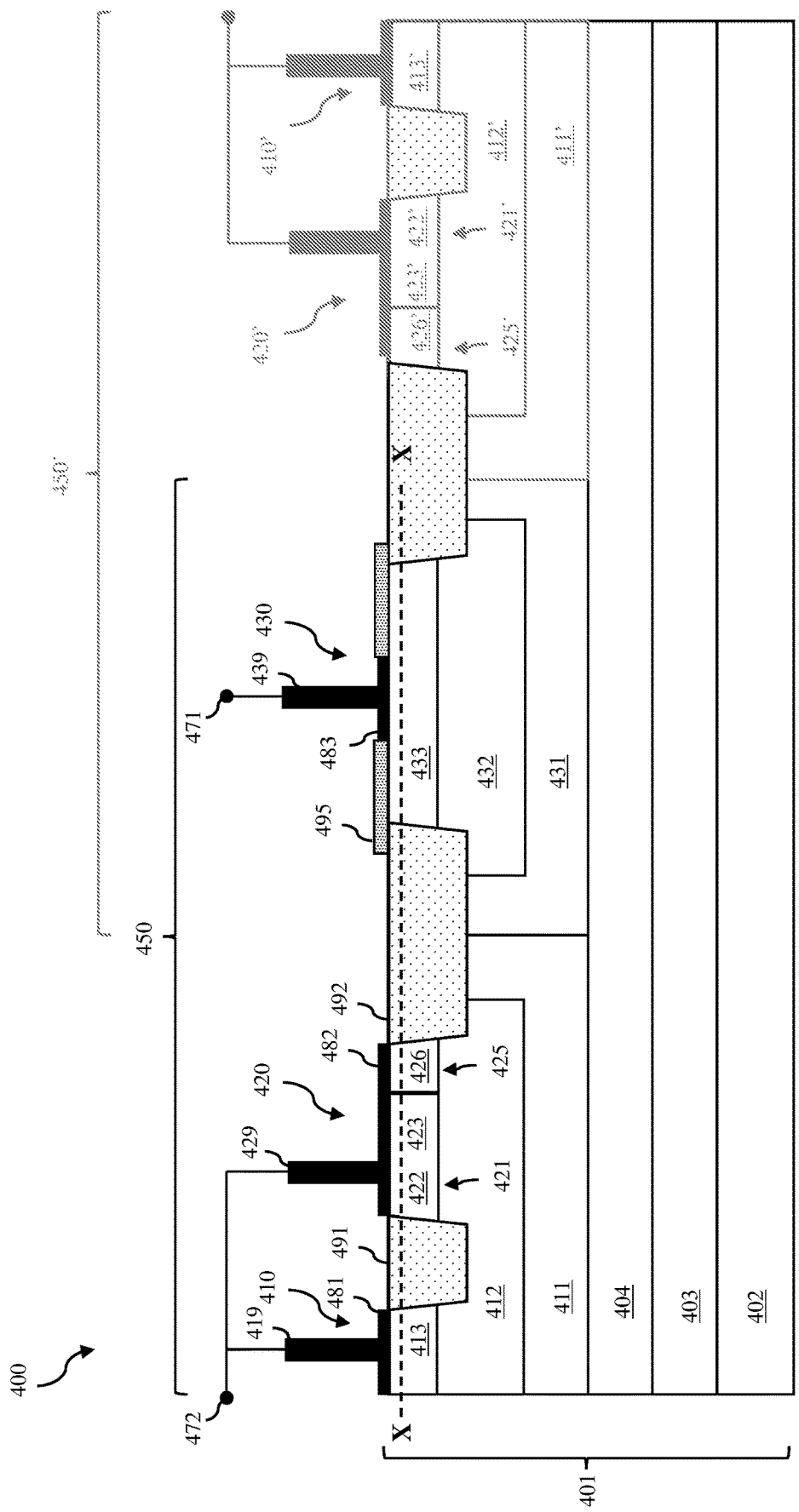
FIGS. 4A and 4B are different cross-section diagrams illustrating an embodiment of a semiconductor structure including a bipolar junction device configured to have a high holding voltage.
Figure 4B:
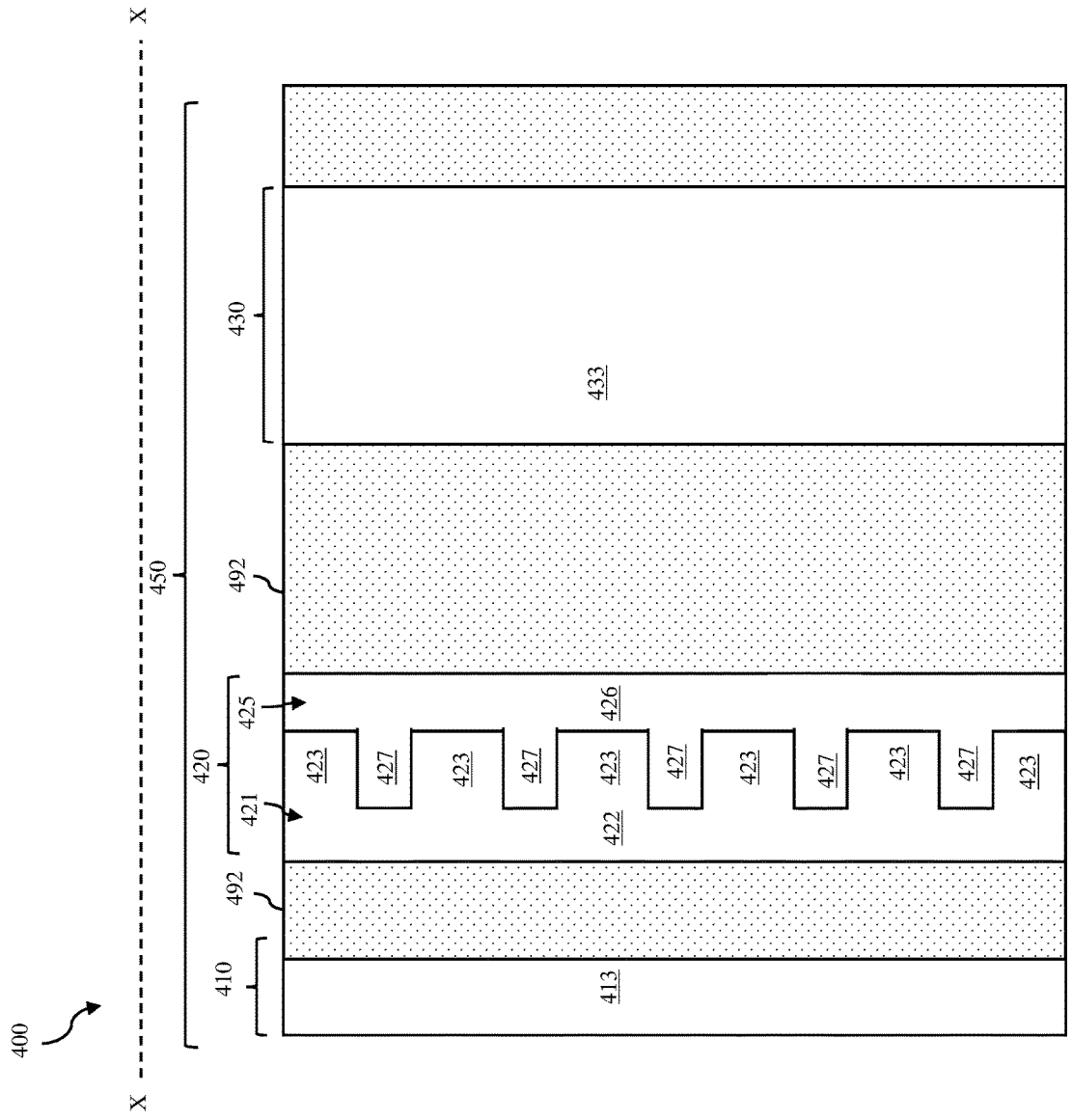
Figure 8A:
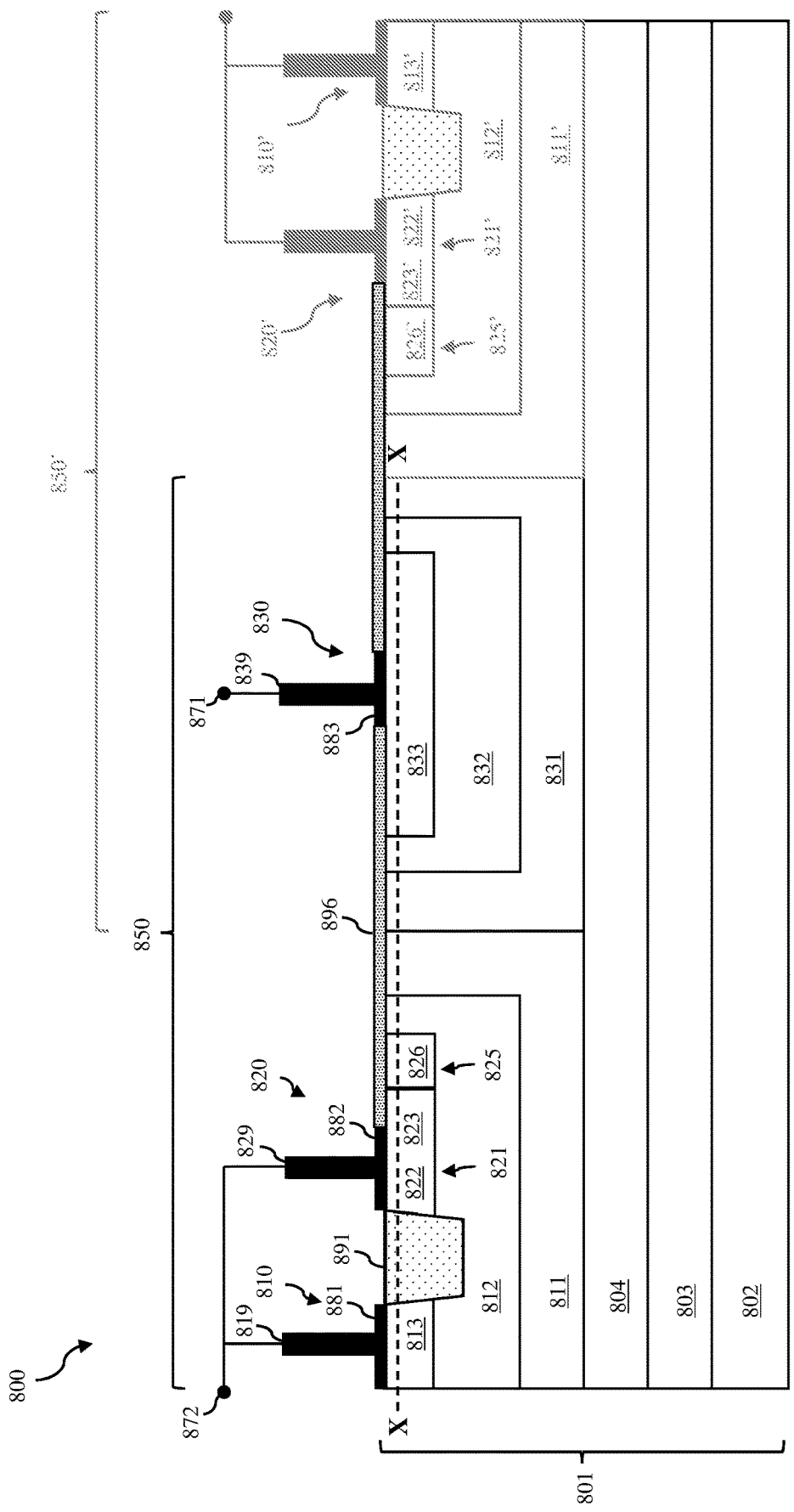
FIGS. 8A and 8B are different cross-section diagrams illustrating an embodiment of a semiconductor structure including a bipolar junction device configured to have a high holding voltage.
Figure 8B:
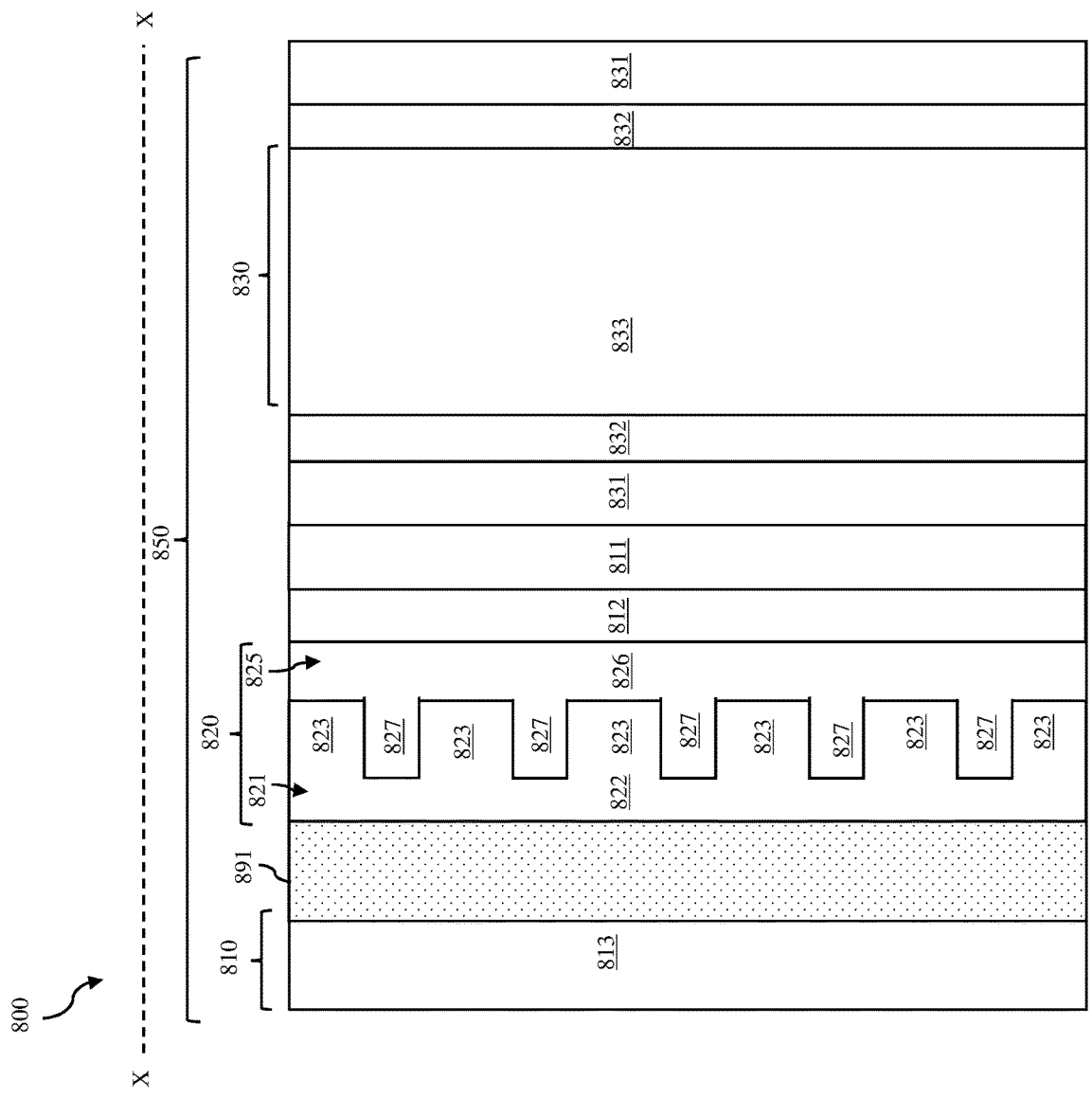

In the bipolar junction device 450 of the semiconductor structure 400 of FIGS. 4A-4B and in the bipolar junction device 850 of the semiconductor structure 800 of FIGS. 8A-8B, the emitter contact region 421, 821 and the ancillary emitter region 425, 825 can have interlocking comb-shapes. Specifically, the emitter contact region 421, 821 can be essentially comb-shaped. That is, the emitter contact region 421, 821 can include an emitter contact region body 422, 822, which extends across the width of the device, which is parallel to the isolation region 491, 891, and which has a first side immediately adjacent to the isolation region 491, 891 and a second side opposite the first side. The emitter contact region 421, 821 can further include emitter contact region extensions 423, 823 that extend laterally from the second side of the emitter contact region body 422, 822 and are physically separated from each other. The ancillary emitter region 425, 825 can similarly be essentially comb-shaped but facing in the opposite direction such that the two regions are interlaced. That is, the ancillary emitter region 425, 825 can include an ancillary emitter region body 426, 826, which extends across the width of the device, which is parallel to the emitter contact region body 422, 822, and which has a first side adjacent to the emitter contact region and a second side opposite the first side. The ancillary emitter region 425, 825 can further include ancillary emitter region extensions 427, 827, which extend laterally from the first side of the ancillary emitter region body 426, 826 to the emitter contact region body 422, 822 between the emitter contact region extensions 423, 823 such that they are immediately adjacent to and between emitter contact region extensions 423, 823.

The semiconductor structure 100, 200, 300, 400, 500, 600, 700, 800 can further include metal silicide layers. The metal silicide layers can include: a base silicide layer 181, 281, 381, 481, 581, 681, 781, 881 on the base contact region 113, 213, 313, 413, 513, 613, 713, 813; an emitter silicide layer 182, 282, 382, 482, 582, 682, 782, 882 on the emitter contact region 121, 221, 321, 421, 521, 621, 721, 821 and a collector silicide layer 183, 283, 383, 483, 583, 683, 783, 883 on the collector contact region 133, 233, 333, 433, 533, 633, 733, 833. It should be noted that the emitter silicide layer 182 can also extend partially or completely over the ancillary emitter region 125, 225, 325, 425, 525, 625, 725, 825, as illustrated in FIGS. 1A, 2A, 3A, 4A, 5A, 6A, 7A and 8A. However, alternatively, the ancillary emitter region could be unsilicided and, thus, floating. For example, see FIG. 1C, which shows an alternative configuration for the device 150 where the emitter silicide layer 182 does not extend laterally over the junction between the emitter contact region 121 and the ancillary emitter region 125 such that the ancillary emitter region 125 remains floating. See also FIG. 5C, which shows an alternative configuration for the device 550 where the emitter silicide layer 582 does not extend laterally over the junction between the emitter contact region 521 and the ancillary emitter region 525 such that the ancillary emitter region 525 remains floating. Optionally, although not shown, the ancillary emitter regions 225, 325, 425, 625, 725, 825 could similarly be unsilicided and, thus, floating. In any case, these metal silicide layers can be, for example, layers of cobalt silicide (CoSi), nickel silicide (NiSi), tungsten silicide (WSi), titanium silicide (TiSi), or any other suitable metal silicide material. These three metal silicide layers (i.e., the base silicide layer, the emitter silicide layer and the collector silicide layer) are discrete layers and are physically separated from each other. That is, none of these three layers is continuous with any of the others in order to prevent coupling, specifically via metal silicide, of the base terminal 110, 210, 310, 410, 510, 610, 710, 810, the emitter terminal 120, 320, 420, 520, 620, 720, 820 (including the emitter contact region and the ancillary emitter region), and/or the collector terminal 130, 230, 330, 430, 530, 630, 730, 830 (including any of the collector well region 131, 231, 331, 431, 531, 631, 731, 831, the addition collector well region 132, 232, 332, 432, 532, 632, 732, 832 (if applicable) and the collector contact region 133, 233, 333, 433, 533, 633, 733, 833).

In each of the semiconductor structure embodiments, the isolation region 191, 291, 391, 491, 591, 691, 791, 891 ensures that the base silicide layer 181, 281, 381, 481, 581, 681, 781, 881 and the emitter silicide layer 182, 282, 382, 482, 582, 682, 782, 882 are not continuous layers (i.e., ensures that the base terminal and the emitter terminal are not shorted together specifically via metal silicide). The embodiments vary, however, with regard to the particular structural configuration that ensures that the emitter silicide layer 182, 282, 382, 482, 582, 682, 782, 882 and the collector silicide layer 183, 283, 383, 483, 583, 683, 783, 883 are also not continuous layers (i.e., to ensure that the emitter terminal and the collector terminal are not shorted together specifically via metal silicide).

Figure 1C:
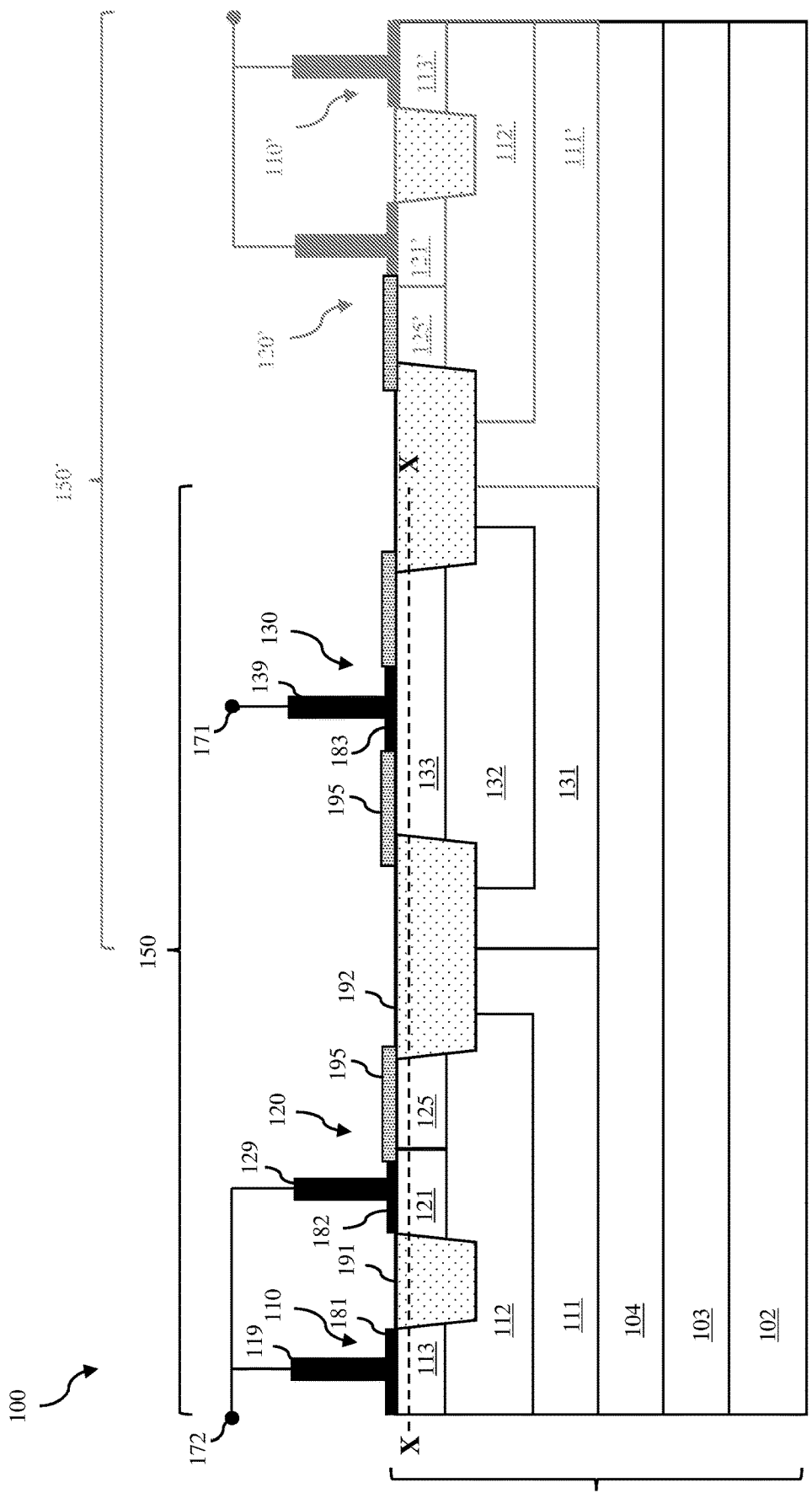
FIG. 1C is a cross-section diagram illustrating an alternative configuration of the device shown in FIG. 1A.

For example, in some embodiments, an additional isolation region 192, 292, 392, 492 can ensure that the emitter silicide layer 182, 282, 382, 482 and the collector silicide layer 183, 283, 383, 483 are not continuous layers (i.e., ensures that the emitter terminal and the collector terminal are not shorted together specifically via metal silicide) (e.g., see the semiconductor structure 100, 200, 300, 400 of FIGS. 1A-1B, 2A-2B, 3A-3B, 4A-4B, respectively). This additional isolation region 192, 292, 392, 492 can be, for example, an additional STI region, as illustrated, or, alternatively, an additional LOCOS region. In any case, this additional isolation region 192, 292, 392, 492 can traverse the junction between the base well region 111, 211, 311, 411 and the collector well region 131, 231, 331, 431, extending into the substrate from the top surface to a depth, which is below the level of the bottoms of the emitter contact region 121, 221, 321, 421, the ancillary emitter region 125, 225, 325, 425, and the collector contact region 133, 233, 333, 433 and which is above the levels of the bottoms of the collector and base well regions (and if applicable above the levels of the bottoms of the additional base and additional collector well regions). This additional isolation region 192, 292, 392, 492 can extend laterally in one direction to the ancillary emitter region 125, 225, 325, 425 (e.g., over a vertical interface between the base well region 111, 211, 311, 411 and additional base well region 112, 212, 312, 412, if present) and in the opposite direction to the collector contact region 133, 233, 333, 433 (e.g., over a vertical interface between the collector well region 131, 231, 331, 431 and the additional collector well region 132, 232, 332, 432, if present). It should be noted that, given the configuration of the emitter terminal in the semiconductor structure 300 of FIGS. 3A-3B, in this embodiment the additional isolation region 392 contacts one end of each emitter contact region segments 324 and each ancillary emitter region segment 328. In any case, in these embodiments, the emitter contact region 121, 221, 321, 421 and the ancillary emitter region 125, 225, 325, 425 of the emitter terminal 120, 220, 320, 420 can have the emitter silicide layer 182, 282, 382, 482 thereon. Furthermore, in these embodiments, the collector contact region 133, 233, 333, 433 of the collector terminal 130, 230, 330, 430 may be essentially fully covered by the collector silicide layer 183, 283, 383, 483 (not shown). Alternatively, a dielectric layer 195, 295, 395, 495 and, particularly, a relatively thin salicide blocking (SAB) layer (e.g., a thin silicon nitride layer or a thin layer of some other suitable dielectric layer suitable from blocking metal silicide layer formation during processing) can cover an edge portion of the collector contact region 133, 233, 333, 433 immediately adjacent to the additional isolation region 192, 292, 392, 492 such that it extends laterally between the additional isolation region 192, 292, 392, 492 and the collector silicide layer 183, 283, 383, 483. Optionally, as illustrated in FIG. 1C, the dielectric layer 195 (i.e., the SAB layer) can further be patterned so as to completely cover the ancillary emitter region 125 in order to prevent the emitter silicide layer 182 from forming thereon and, thereby to ensure that the ancillary emitter region remains unsilicided and floating. Although not shown, more complex patterning of the dielectric layers 295, 395, 495 (i.e., the SAB layers) of FIGS. 2A, 3A, 4A could be performed to completely cover the ancillary emitter regions 225, 325, 425 so the emitter silicide layer 282, 382, 482 is only formed on the emitter contact region 221, 321, 421 and, thus, so that the ancillary emitter regions 225, 325, 425 remain unsilicided and floating.

Figure 5C:
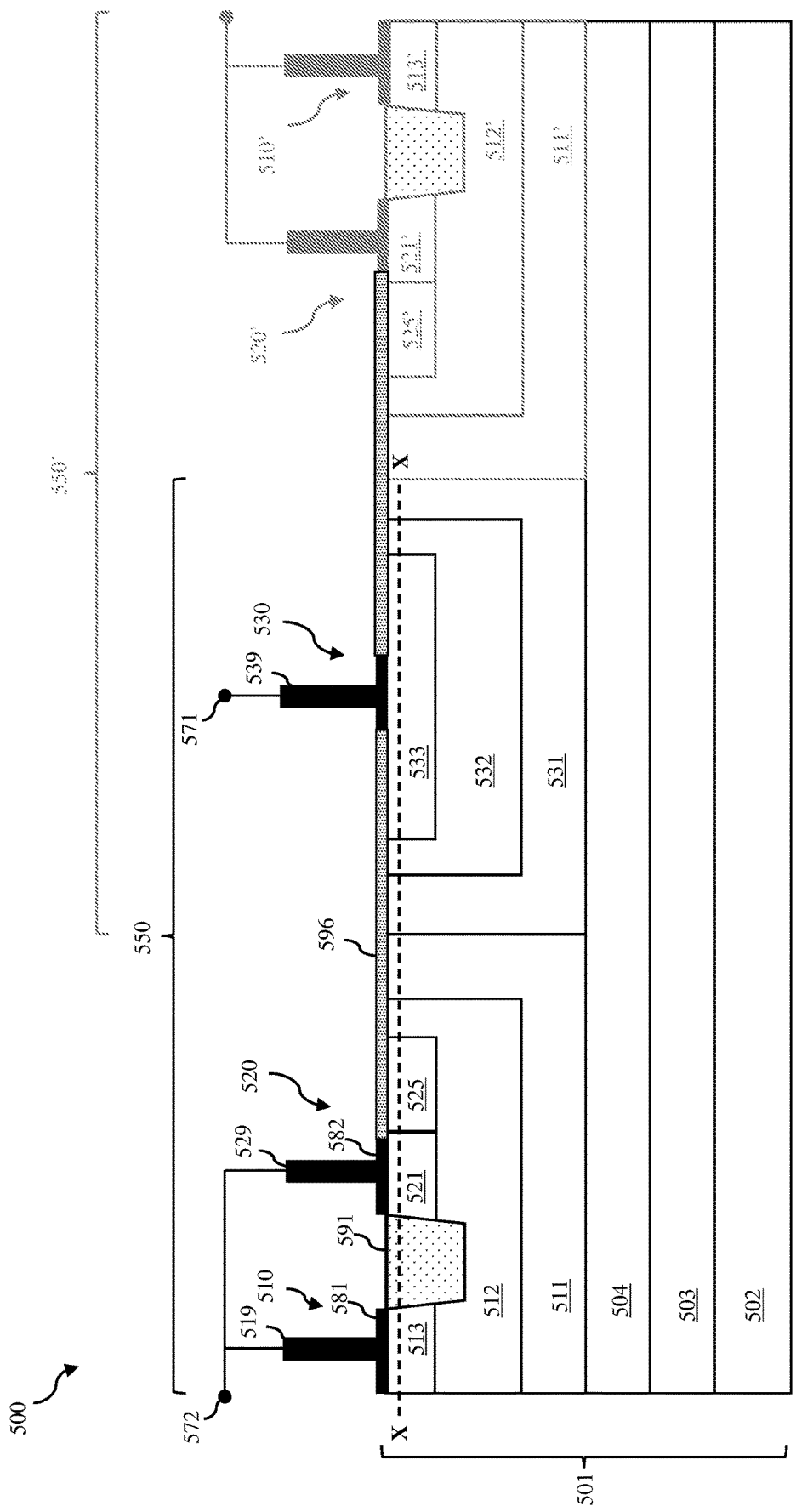
FIG. 5C is a cross-section diagram illustrating an alternative configuration of the device shown in FIG. 5A.

In other embodiments, a dielectric layer 596, 696, 796, 896 can ensure that the emitter silicide layer 582, 682, 782, 882 and the collector silicide layer 583, 683, 783, 883 are not continuous layers (i.e., ensures that the emitter terminal and the collector terminal are not shorted together specifically via metal silicide) (e.g., see the semiconductor structure 500, 600, 700, 800 of FIGS. 5A-5B, 6A-6B, 7A-7B, 8A-8B, respectively). This dielectric layer 596, 696, 796, 896 can be a relatively thin salicide blocking (SAB) layer (e.g., a thin silicon nitride layer or a thin layer of some other suitable dielectric layer suitable from blocking metal silicide layer formation during processing). This dielectric layer 596, 696, 796, 896 can be patterned so that it traverses the junction between the base well region 511, 611, 711, 811 and the collector well region 531, 631, 731, 831, so that it extends laterally in one direction to the ancillary emitter region 525, 625, 725, 825 (e.g., over a vertical interface between the base well region 511, 611, 711, 811 and additional base well region 512, 612, 712, 812, if present) and in the opposite direction to the collector contact region 533, 633, 733, 833 (e.g., over a vertical interface between the collector well region 531, 631, 731, 831 and the additional collector well region 532, 632, 732, 832, if present). It should be noted that, depending upon the configuration of the emitter terminal, the dielectric layer 596, 696, 796, 896 can partially or optionally fully cover the ancillary emitter region 525, 625, 725, 825. For example, in the semiconductor structure 500, the dielectric layer 596 can be patterned so that it extends laterally either to the ancillary emitter region 525 without completely covering it such that the emitter silicide layer 582 is formed on both the emitter contact region 521 and the ancillary emitter region 525 (as shown in FIG. 5A). Alternatively, in the semiconductor structure 500, the dielectric layer 596 can be patterned so that it completely covers that ancillary emitter region 525 and, thus, so that only the emitter contact region 521 is covered by the emitter silicide layer 582 and so that the ancillary emitter region 525 remains unsilicided and floating (as shown in FIG. 5C). In the semiconductor structure 600 of FIGS. 6A-6B, the dielectric layer 696 can be patterned so that it extends laterally onto the comb-shaped ancillary emitter region 625 and optionally so that it completely covers the ancillary emitter region body 626 and, thus, so that the discrete emitter contact region segments 624 and the ancillary emitter region extensions 627 of the ancillary emitter region 625 are covered by the emitter silicide layer 682 (as illustrated). In the semiconductor structure 700 of FIGS. 7A-7B, the dielectric layer 796 can be patterned so that it extends laterally onto the adjacent ends only of the emitter contact region segments 724 and the ancillary emitter region segments 728 (as illustrated). In the semiconductor structure 800 of FIGS. 8A-8B, the dielectric layer 896 can be patterned so that it extends laterally onto the comb-shaped ancillary emitter region 825 and optionally so that it completely covers the ancillary emitter region body 826 and, thus, so that the entire emitter contact region 821 and the ancillary emitter region extensions 827 of the ancillary emitter region 825 are covered by the emitter silicide layer 882 (as illustrated). It should be understood that, although not shown, more complex patterning of the dielectric layers 696, 796, 896 (i.e., the SAB layers) of FIGS. 6A, 7A, 8A could potentially be performed to completely cover the ancillary emitter regions 625, 725, 825 so the emitter silicide layer 682, 782, 882 is only on the emitter contact region 621, 721, 821 and, thus, so that the ancillary emitter regions remain unsilicided and floating.

Optionally, the semiconductor structure 100, 200, 300, 400, 500, 600, 700, 800 can include an additional bipolar junction device 150', 250', 350', 450', 550', 650', 750', 850', as illustrated. The bipolar junction device 150, 250, 350, 450, 550, 650, 750, 850 and the additional bipolar junction device 150', 250', 350', 450', 550', 650', 750', 850' can be essentially identical but mirror image/symmetric structures on either side of a shared collector terminal, as illustrated.

In any case, terminal contacts can land on the metal silicide layers to contact the respective contact regions. That is, at least one base terminal contact 119, 219, 319, 419, 519, 619, 719, 819 can land on the base contact region 113, 213, 313, 413, 513, 613, 713, 813 (or the base silicide layer thereon), at least one emitter terminal contact 129, 229, 329, 429, 529, 629, 729, 829 can land on the emitter contact region 121, 221, 321, 421, 521, 621, 721, 821 (or the emitter silicide layer thereon), and at least one collector terminal contact 139, 239, 339, 439, 539, 639, 739, 839 can land on the collector contact region 133, 233, 333, 433, 533, 633, 733, 833 (or the collector silicide layer thereon). It should be understood that the ancillary emitter region can remain floating during device operation (e.g., when it is not electrically connected to the emitter contact region by a silicide layer thereon and no contact lands thereon).

It should be noted that, due to the combination of the first buried well region 103, 203, 303, 403, 503, 603, 703, 803 and the second buried well region 104, 204, 304, 504, 604, 704 804, the bipolar junction device 150, 250, 350, 450, 650, 750, 850, 850 has essentially complete vertical isolation from the lower portion 102, 202, 302, 402, 502, 602, 702, 802 of the semiconductor substrate 101, 201, 301, 401, 501, 601, 701, 801.

Thus, the above-described bipolar junction device 150, 250, 350, 450, 550, 650, 750, 850 can be employed, for example, as an electrostatic discharge (ESD) device. For example, in the case of an NPN-type bipolar junction device employed as an ESD device, the collector terminal contact(s) 139, 239, 339, 439, 539, 639, 739, 839 can be coupled to a first pad 171, 271, 371, 471, 571, 671, 771, 871 (e.g., an input/output (I/O) pad that, for example, facilitates input and/or output signal transmission between a chip and an external pin of a chip package; a power pad that, for example, connects the chip to a power supply line (e.g., Vdd or Vss) line; etc.), which is also coupled to a the device or circuit to be protected by the ESD device. The base terminal contact(s) 119, 219, 319, 419, 519, 619, 719, 819 and the emitter terminal contact(s) 129, 229, 329, 429, 529, 629, 729, 829 can be coupled to a second pad 172, 272, 372, 472, 572, 672, 772, 872, which is connected to ground. In this case, when the voltage level on the first pad 171, 271, 371, 471, 571, 671, 771, 871 is high enough to cause damage to the device or circuit being protected, the NPN-type bipolar junction device will turn on and shunt current flow away from the device or circuit being protected.

It should be noted that, in the bipolar junction device 150, 250, 350, 450, 550, 650, 750, 850, the ancillary emitter region 125, 225, 325, 425, 525, 625, 725, 825 (which, as discussed above, abuts and has a different conductivity type than emitter contact region 121, 221, 321, 421, 521, 621, 721, 821) is employed to increase the holding of the device without incurring any significant corresponding increase in device area. During design, the specific configurations of the emitter contact region 121, 221, 321, 421, 521, 621, 721, 821 and the ancillary emitter region 125, 225, 325, 425, 525, 625, 725, 825 (including, but not limited to, the ratio of the areas of the emitter contact region to the ancillary emitter region, the numbers of emitter contact region and ancillary emitter region extensions/segments, the interlocking shapes of the emitter contact region and ancillary emitter region, the numbers of contacts on the emitter contact region or segments/extensions thereof, etc.) can be selectively adjusted (e.g., based on the results of simulations) in order to modulate parasitic lateral bipolar gain, to improve latch-up immunity, to regulate the snapback mechanism, and to adjust the holding voltage and, thereby optimize ESD performance.

Those skilled in the art will recognize that the above-described semiconductor structure 100, 200, 300, 400, 500, 600, 700, 800, including a bipolar junction device 150, 250, 350, 450, 550, 650, 750, 850 can be formed using front end of the line (FEOL) processing (possibly including, but not limited to, shallow trench isolation (STI) or LOCOS region formation, dopant implantation to form buried well, wells, and other dopant implant regions, optional in situ-doped epitaxial semiconductor deposition to form additional doped regions, salicide blocking (SAB) layer formation and patterning, silicide layer formation, etc.), middle of the line (MOL) processing (possibly including, but not limited to, interlayer dielectric deposition and contact formation), and back end of the line (BEOL) process (possible including, but not limited to, interconnect formation to connect contacts to pads/other device). Such FEOL, MOL and BEOL processing can, however, be performed in a novel manner (e.g., using specifically configured masks/patterning steps, etc.) that have been established to ensure that the bipolar junction device 150, 250, 350, 450, 550, 650, 750, 850 has the various features described in detail above including, but not limited to: (1) the emitter terminal 120, 220, 320, 420, 520, 620, 720, 820 including, within a base well region having a first-type conductivity, an emitter contact region 121, 221, 321, 421, 521, 621, 721, 821 with a second-type conductivity and also an ancillary emitter region 125, 225, 325, 425, 525, 625, 725, 825 that abuts the emitter contact region 121, 221, 321, 421, 521, 621, 721, 821 and that has the first-type conductivity; (2) the first-type conductivity level being graded upward (e.g., increasing in a stepped fashion) from the second buried well region 104, 204, 304, 504, 604, 704, 804 (which, for example, has a higher first-type conductivity level than the lower portion 102, 202, 302, 402, 502, 602, 702, 802 of the substrate), to the base well region 111, 211, 311, 411, 511, 611, 711, 811, to the additional base well region 112, 212, 312, 412, 512, 612, 712, 812 (if present), and finally to the base contact region 113, 213, 313, 413, 513, 613, 713, 813; (3) the second-type conductivity level also being graded upward (e.g., increasing in a stepped fashion) from the collector well region 131, 231, 331, 431, 531, 631, 731, 831 (which, for example, has a higher second-type conductivity level than the first buried well region 103, 203, 303, 403, 503, 603, 703, 803), to the additional collector well region 132, 232, 332, 432, 532, 632, 732, 832 (if present), to the collector contact region 133, 233, 333, 433, 533, 633, 733, 833; and (4) due to the first and second well regions, essentially complete vertical isolation from the lower portion 102, 202, 302, 402, 502, 602, 720, 802 of the semiconductor substrate 101, 201, 301, 401, 501, 601, 701, 801.

It should be understood that in the structures and method described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Additionally, the method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate having a first surface and a second surface opposite the first surface; and
a device comprising:
a base well region within the semiconductor substrate;
a base contact region adjacent to the base well region at the second surface, wherein the base well region and the base contact region have a first-type conductivity;
an emitter contact region adjacent to the base well region at the second surface, separated from the base contact region by an isolation region, and having a second-type conductivity that is different from the first-type conductivity, wherein the emitter contact region includes discrete emitter contact region segments; and
an ancillary emitter region adjacent to the base well region at the second surface, immediately adjacent to the emitter contact region, and having the first-type conductivity, wherein the ancillary emitter region includes: an ancillary emitter region body parallel to and separated from the isolation region and extending across a width of the device; and ancillary emitter region extensions, wherein the discrete emitter contact region segments extend laterally from the isolation region to the ancillary emitter region body, and wherein the ancillary emitter region extensions extend laterally from the ancillary emitter region body to the isolation region so the discrete emitter contact region segments and the ancillary emitter region extensions alternate across the width of the device.

2. The structure of claim 1, wherein the device comprises an electrostatic discharge device connected to any one of an input/output pad and a power pad.

3. The structure of claim 1,
wherein the device further comprises an additional base well region within and shallower than the base well region,
wherein the base contact region is within the additional base well region, and
wherein the additional base well region has the first-type conductivity at a lower first-type conductivity level than the base contact region and at a higher first-type conductivity level than the base well region.

4. The structure of claim 1, wherein the device further comprises:
a collector well region within the semiconductor substrate and positioned laterally immediately adjacent to the base well region; and
a collector contact region adjacent to the collector well region at the second surface, wherein the collector well region and the collector contact region have the second-type conductivity.

5. The structure of claim 4,
wherein the device further comprises an additional collector well region within and shallower than the collector well region, and
wherein the additional collector well region has the second-type conductivity at a lower second-type conductivity level than the collector contact region and at a higher second-type conductivity level than the collector well region.

6. The structure of claim 4, further comprising:
an additional isolation region in the semiconductor substrate traversing a junction between the base well region and the collector well region, wherein the additional isolation region is shallower in depth than the base well region and the collector well region and wherein opposing sidewalls of the additional isolation region are immediately adjacent to the ancillary emitter region and the collector contact region, respectively;
a base silicide layer on the base contact region;
an emitter silicide layer on the emitter contact region and the ancillary emitter region;
a collector silicide layer on the collector contact region; and
a dielectric layer on the second surface extending laterally from the additional isolation region to the collector silicide layer.

7. The structure of claim 4, further comprising:
a base silicide layer on the base contact region;
an emitter silicide layer on the emitter contact region;
a collector silicide layer on the collector contact region; and
a dielectric layer on the second surface extending laterally from the emitter silicide layer to the collector silicide layer and traversing a junction between the base well region and the collector well region.

8. A structure comprising:
a semiconductor substrate having a first surface and a second surface opposite the first surface; and
a device comprising:
a base well region within the semiconductor substrate;
a base contact region adjacent to the base well region at the second surface, wherein the base well region and the base contact region have a first-type conductivity;
an emitter contact region adjacent to the base well region at the second surface, separated from the base contact region by an isolation region and having a second-type conductivity that is different from the first-type conductivity, wherein the emitter contact region includes: an emitter contact region body abutting and parallel to the isolation region and further extending across a width of the device; and emitter contact region extensions; and
an ancillary emitter region adjacent to the base well region at the second surface, immediately adjacent to the emitter contact region, and having the first-type conductivity, wherein the ancillary emitter region includes: an ancillary emitter region body parallel to and separated from the emitter contact region body and further extending across the width of the device; and ancillary emitter region extensions, wherein the emitter contact region extensions extend laterally from the emitter contact region body to the ancillary emitter region body, and wherein the ancillary emitter region extensions extend laterally from the ancillary emitter region body to the emitter contact region body with the emitter contact region extensions and the ancillary emitter region extensions alternating across the width of the device.

9. The structure of claim 8, wherein the device comprises an electrostatic discharge device connected to any one of an input/output pad and a power pad.

10. The structure if claim 8,
wherein the device further comprises an additional base well region within and shallower than the base well region,
wherein the base contact region is within the additional base well region, and
wherein the additional base well region has the first-type conductivity at a lower first-type conductivity level than the base contact region and at a higher first-type conductivity level than the base well region.

11. The structure of claim 8, wherein the device further comprises:
a collector well region within the semiconductor substrate and positioned laterally immediately adjacent to the base well region; and
a collector contact region adjacent to the collector well region at the second surface, wherein the collector well region and the collector contact region have the second-type conductivity.

12. The structure of claim 11,
wherein the device further comprises an additional collector well region within and shallower than the collector well region, and
wherein the additional collector well region has the second-type conductivity at a lower second-type conductivity level than the collector contact region and at a higher second-type conductivity level than the collector well region.

13. The structure of claim 11, further comprising:
an additional isolation region in the semiconductor substrate traversing a junction between the base well region and the collector well region, wherein the additional isolation region is shallower in depth than the base well region and the collector well region and wherein opposing sidewalls of the additional isolation region are immediately adjacent to the ancillary emitter region and the collector contact region, respectively;
a base silicide layer on the base contact region;
an emitter silicide layer on the emitter contact region and the ancillary emitter region;
a collector silicide layer on the collector contact region; and a dielectric layer on the second surface extending laterally from the additional isolation region to the collector silicide layer.

14. The structure of claim 11, further comprising:
a base silicide layer on the base contact region;
an emitter silicide layer on the emitter contact region and the ancillary emitter region;
a collector silicide layer on the collector contact region; and
a dielectric layer on the second surface extending laterally from the emitter silicide layer to the collector silicide layer and traversing a junction between the base well region and the collector well region.

15. A structure comprising:
a semiconductor substrate having a first surface and a second surface opposite the first surface; and
a device comprising:
a base well region within the semiconductor substrate;
a base contact region adjacent to the base well region at the second surface, wherein the base well region and the base contact region have a first-type conductivity;
an emitter contact region adjacent to the base well region at the second surface, separated from the base contact region by an isolation region, and having a second-type conductivity that is different from the first-type conductivity, wherein the emitter contact region includes discrete emitter contact region segments;
an ancillary emitter region adjacent to the base well region at the second surface, immediately adjacent to the emitter contact region, and having the first-type conductivity, wherein the ancillary emitter region includes: an ancillary emitter region body parallel to and separated from the isolation region and extending across a width of the device; and ancillary emitter region extensions, wherein the discrete emitter contact region segments extend laterally from the isolation region to the ancillary emitter region body, and wherein the ancillary emitter region extensions extend laterally from the ancillary emitter region body to the isolation region so the discrete emitter contact region segments and the ancillary emitter region extensions alternate across the width of the device;
a collector well region within the semiconductor substrate and positioned laterally immediately adjacent to the base well region; and
a collector contact region at the second surface adjacent to the collector well region, wherein the collector contact region and the collector well region have the second-type conductivity, wherein the base region and the emitter contact region are electrically connected to ground, and wherein the collector contact region is electrically connected to any of an input/output pad and a power pad.

16. The structure of claim 15,
wherein the device further comprises an additional base well region within and shallower than the base well region,
wherein the base contact region is within the additional base well region,
wherein the additional base well region has the first-type conductivity at a lower first-type conductivity than the base contact region and at a higher first-type conductivity level than the base well region,
wherein the device further comprises an additional collector well region within and shallower than the collector well region, and
wherein the additional collector well region has the second-type conductivity at a lower second-type conductivity than the collector contact region and at a higher second-type conductivity level than the collector well region.

17. The structure of claim 16, further comprising:
an additional isolation region in the semiconductor substrate traversing a junction between the base well region and the collector well region, wherein the additional isolation region is shallower in depth than the base well region and the collector well region and wherein opposing sidewalls of the additional isolation region are immediately adjacent to the ancillary emitter region and the collector contact region, respectively;
a base silicide layer on the base contact region;
an emitter silicide layer on the emitter contact region and the ancillary emitter region;
a collector silicide layer on the collector contact region; and
a dielectric layer on the second surface extending laterally from the additional isolation region to the collector silicide layer.

18. The structure of claim 16, further comprising:
a base silicide layer on the base contact region;
an emitter silicide layer on the emitter contact region;
a collector silicide layer on the collector contact region; and
a dielectric layer on the second surface extending laterally from the emitter silicide layer to the collector silicide layer and traversing a junction between the base well region and the collector well region.

19. The structure of claim 1, further comprising an additional device, wherein the device and the additional device share a collector region and are symmetric relative to the collector region.

20. The structure of claim 8, further comprising an additional device, wherein the device and the additional device share a collector region and are symmetric relative to the collector region.

* * * * *